United States Patent
Inoue

(10) Patent No.: US 12,451,859 B2
(45) Date of Patent: Oct. 21, 2025

(54) ACOUSTIC WAVE DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 300 days.

(21) Appl. No.: 18/121,807

(22) Filed: Mar. 15, 2023

(65) Prior Publication Data
US 2023/0216475 A1 Jul. 6, 2023

Related U.S. Application Data

(63) Continuation of application No. PCT/JP2021/034203, filed on Sep. 16, 2021.
(Continued)

(51) Int. Cl.
  *H03H 9/02* (2006.01)
  *H03H 9/13* (2006.01)
  (Continued)

(52) U.S. Cl.
  CPC .... *H03H 9/02228* (2013.01); *H03H 9/02031* (2013.01); *H03H 9/13* (2013.01);
  (Continued)

(58) Field of Classification Search
  CPC .. H03H 9/02228; H03H 9/02031; H03H 9/13; H03H 9/173; H03H 9/176;
  (Continued)

(56) References Cited

U.S. PATENT DOCUMENTS

2014/0009032 A1* 1/2014 Takahashi .......... H03H 9/02559
                                                            29/25.35
2014/0175945 A1    6/2014 Kando
(Continued)

FOREIGN PATENT DOCUMENTS

JP    2009232189 A    10/2009
JP    2012257019 A    12/2012
(Continued)

OTHER PUBLICATIONS

International Search Report in PCT/JP2021/034203, mailed Nov. 9, 2021, 3 pages.
(Continued)

*Primary Examiner* — Jorge L Salazar, Jr.
(74) *Attorney, Agent, or Firm* — Keating & Bennett, LLP

(57) ABSTRACT

An acoustic wave device includes a support substrate, a piezoelectric layer, and a functional electrode. As seen in a first direction of the support substrate, the piezoelectric layer overlaps the support substrate. The functional electrode extends over a first major surface of the piezoelectric layer. A space is opposite to the first major surface of the piezoelectric layer and at or adjacent to a second major surface of the piezoelectric layer. In the first direction, the functional electrode extends over an overlap region that overlaps the space, and a non-overlap region that does not overlap the space. In the non-overlap region, at least one of an insulating film and a void is located between the functional electrode and the piezoelectric layer.

20 Claims, 16 Drawing Sheets

Related U.S. Application Data

(60) Provisional application No. 63/079,045, filed on Sep. 16, 2020.

(51) Int. Cl.
  *H03H 9/17* (2006.01)
  *H03H 9/56* (2006.01)

(52) U.S. Cl.
  CPC ............ *H03H 9/173* (2013.01); *H03H 9/176* (2013.01); *H03H 9/562* (2013.01); *H03H 9/564* (2013.01); *H03H 9/568* (2013.01)

(58) Field of Classification Search
  CPC ........ H03H 9/562; H03H 9/564; H03H 9/568; H03H 9/174; H03H 9/02157; H03H 9/02118; H03H 9/14502; H03H 9/02559; H03H 9/25
  USPC .......................... 333/133, 186–188, 193–196
  See application file for complete search history.

(56) References Cited

U.S. PATENT DOCUMENTS

| | | |
|---|---|---|
| 2019/0036510 A1 | 1/2019 | Kikuchi et al. |
| 2021/0175872 A1* | 6/2021 | Daimon ................. H03H 9/568 |

FOREIGN PATENT DOCUMENTS

| | | |
|---|---|---|
| WO | 2007119643 A1 | 10/2007 |
| WO | 2013031724 A1 | 3/2013 |
| WO | 2017179300 A1 | 10/2017 |

OTHER PUBLICATIONS

Written Opinion in PCT/JP2021/034203, mailed Nov. 9, 2021, 4 pages.

* cited by examiner

ACOUSTIC WAVE DEVICE

CROSS REFERENCE TO RELATED APPLICATIONS

This application claims the benefit of priority to Provisional Application No. 63/079,045 filed on Sep. 16, 2020 and is a Continuation Application of PCT Application No. PCT/JP2021/034203 filed on Sep. 16, 2021. The entire contents of each application are hereby incorporated herein by reference.

BACKGROUND OF THE INVENTION

1. Field of the Invention

The present disclosure relates to an acoustic wave device with a piezoelectric layer including lithium niobate or lithium tantalate.

2. Description of the Related Art

Japanese Unexamined Patent Application Publication No. 2012-257019 describes an acoustic wave device.

SUMMARY OF THE INVENTION

For the acoustic wave device described in Japanese Unexamined Patent Application Publication No. 2012-257019, a demand exists to reduce ripples in frequency characteristics.

Preferred embodiments of the present invention provide acoustic wave devices that each allows for reduced ripples in frequency characteristics.

An acoustic wave device according to an aspect of an example embodiment of the present disclosure includes a support substrate, a piezoelectric layer overlapping the support substrate as seen in a first direction, and a functional electrode extending over at least a first major surface of the piezoelectric layer. A space is provided in a location opposite to the first major surface of the piezoelectric layer and at or adjacent to a second major surface of the piezoelectric layer. The space is at least partially covered by the piezoelectric layer. In the first direction, the functional electrode extends over an overlap region that overlaps the space, and a non-overlap region that does not overlap the space. In the overlap region, the functional electrode, and the first major surface of the piezoelectric layer are in contact with each other. In the non-overlap region of the functional electrode, at least one of an insulating film and a void is between the functional electrode and the piezoelectric layer.

An acoustic wave device according to an aspect of an example embodiment of the present disclosure includes a support substrate, a piezoelectric layer overlapping the support substrate as seen in a first direction, a first resonator extending over at least a first major surface of the piezoelectric layer, and a second resonator at a location of the support substrate different from a location of the first resonator. The first resonator includes a first space defined by a hollow in a portion of the support substrate, or a first space defined by an air gap between the support substrate and the piezoelectric layer, the piezoelectric layer that covers at least a portion of the first space, and a first electrode and a second electrode of the first resonator, the first electrode and the second electrode of the first resonator each extending over a first overlap region and a non-overlap region, the first overlap region overlapping the first space as seen in the first direction, the non-overlap region not overlapping the first space as seen in the first direction, the first electrode and the second electrode of the first resonator facing each other in a second direction. The second resonator includes a second space defined by a hollow in a portion of the support substrate, or a second space defined by an air gap between the support substrate and the piezoelectric layer, the piezoelectric layer that covers at least a portion of the second space, and a first electrode and a second electrode of the second resonator, the first electrode and the second electrode of the second resonator each extending over a second overlap region and the non-overlap region, the second overlap region overlapping the second space as seen in the first direction, the non-overlap region not overlapping the second space as seen in the first direction, the first electrode and the second electrode of the second resonator facing each other in the second direction. The second space is at a location different from a location of the first space. In at least a portion of the non-overlap region sandwiched between the first space and the second space, at least one of an insulating film and a void is in at least one of a location between the first electrode of the first resonator and the piezoelectric layer and a location between the second electrode of the second resonator and the piezoelectric layer. The first electrode of the first resonator, and the second electrode of the second resonator are in the non-overlap region sandwiched between the first space and the second space.

Preferred embodiments of the present disclosure reduce ripples in frequency characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below in detail with reference to the drawings. These preferred embodiments, however, are not intended to be limiting of the present disclosure. The disclosed preferred embodiments are intended to be illustrative only. Modifications that allow features to be partially combined or replaced with each other between different preferred embodiments, and matters described with reference to the second and subsequent preferred embodiments that are identical to those described with reference to the first preferred embodiment will not be described in further detail, and the following description will focus only on differences. In particular, the same or similar operational effects provided by the same or similar features will not be described for each individual preferred embodiment.

First Preferred Embodiment

Figure 1A:
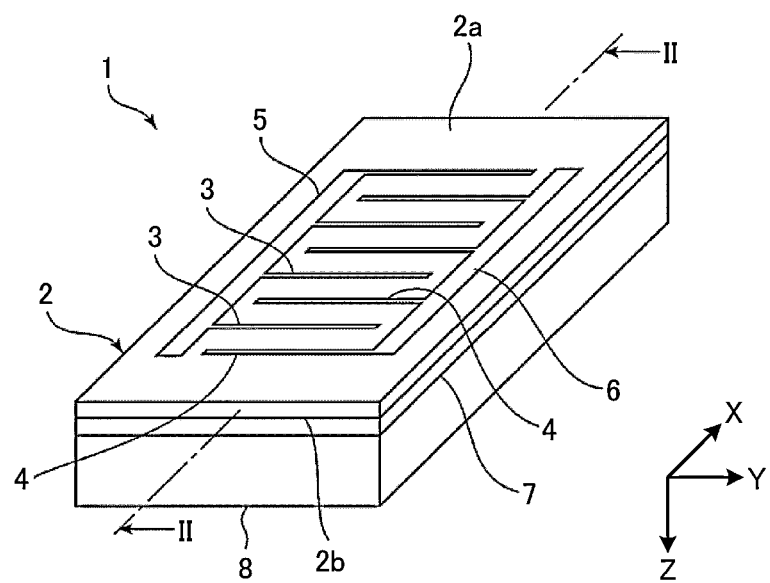
FIG. 1A is a perspective view of an acoustic wave device according to a first preferred embodiment of the present invention.
Figure 1B:
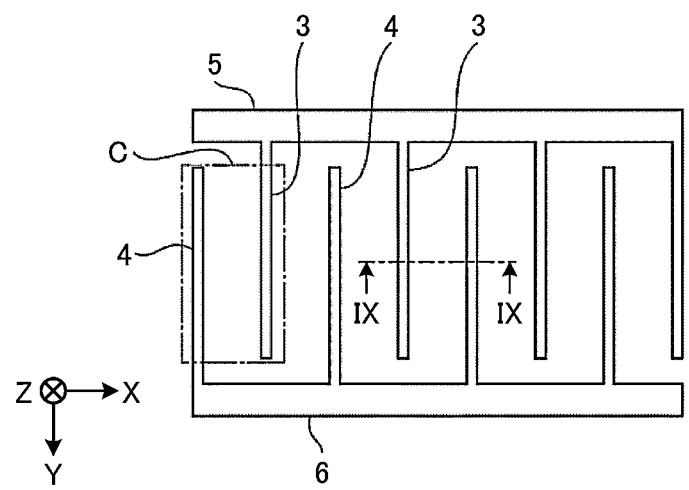
FIG. 1B is a plan view of an arrangement of electrodes according to the first preferred embodiment of the present invention.

FIG. 1A is a perspective view of an acoustic wave device according to a first preferred embodiment. FIG. 1B is a plan view of an arrangement of electrodes according to the first preferred embodiment.

An acoustic wave device 1 according to the first preferred embodiment includes a piezoelectric layer 2 made of $LiNbO_3$. The piezoelectric layer 2 may be made of $LiTaO_3$. The $LiNbO_3$ or $LiTaO_3$ used has a Z-cut angle according to the first preferred embodiment. The $LiNbO_3$ or $LiTaO_3$ used may have a rotated Y-cut angle or an X-cut angle. Preferred orientations of propagation are Y-propagation and X-propagation±30°.

Although the thickness of the piezoelectric layer 2 is not particularly limited, from the viewpoint of effectively exciting a first-order thickness shear mode, the piezoelectric layer 2 preferably has a thickness of greater than or equal to about 50 nm and less than or equal to about 1000 nm, for example.

The piezoelectric layer 2 has a first major surface 2a and a second major surface 2b that are opposite to each other in a Z-direction. An electrode 3 and an electrode 4 extend over the first major surface 2a.

The electrode 3 corresponds to an example of a "first electrode", and the electrode 4 corresponds to an example of a "second electrode". In FIGS. 1A and 1B, a plurality of electrodes 3 (hereinafter referred to in the singular as "electrode 3" for convenience unless otherwise indicated) are connected with a first busbar 5. A plurality of electrodes 4 (hereinafter referred to in the singular as "electrode 4" for convenience unless otherwise indicated) are connected with a second busbar 6. Each electrode 3 and each electrode 4 are interdigitated with each other.

Each of the electrode 3 and the electrode 4 is rectangular or substantially rectangular in shape, and has a longitudinal direction. In a direction orthogonal to the longitudinal direction, the electrode 3, and the electrode 4 adjacent to the electrode 3 face each other. The longitudinal direction of the electrodes 3 and 4, and a direction orthogonal to the longitudinal direction of the electrodes 3 and 4 are each a direction that crosses the thickness direction of the piezoelectric layer 2. It can thus be said that the electrode 3, and the electrode 4 adjacent to the electrode 3 face each other in a direction that crosses the thickness direction of the piezoelectric layer 2. In the following description of the first preferred embodiment, it will be sometimes assumed that the thickness direction of the piezoelectric layer 2 is a Z-direction (or a first direction), a direction orthogonal to the longitudinal direction of the electrodes 3 and 4 is an X-direction (or a second direction), and the longitudinal direction of the electrodes 3 and 4 is a Y-direction (or a third direction).

The longitudinal direction of the electrodes 3 and 4 may be interchanged with the direction orthogonal to the longitudinal direction of the electrodes 3 and 4 illustrated in FIGS. 1A and 1B. That is, the electrode 3 and the electrode 4 may extend in a direction in which the first busbar 5 and the second busbar 6 extend in FIGS. 1A and 1B. In that case, the first busbar 5 and the second busbar 6 extend in a direction in which the electrode 3 and the electrode 4 extend in FIGS. 1A and 1B. A plurality of pairs of mutually adjacent electrodes 3 and 4, each pair including the electrode 3 connected with one potential and the electrode 4 connected with the other potential, are disposed in the direction orthogonal to the longitudinal direction of the electrodes 3 and 4.

When it is stated herein that the electrode 3 and the electrode 4 are adjacent to each other, it is not meant that the electrode 3 and the electrode 4 are disposed in direct contact with each other but it is meant that the electrode 3 and the electrode 4 are disposed with a spacing therebetween. Further, if the electrode 3 and the electrode 4 are adjacent to each other, no electrode connected with a hot electrode or a ground electrode, such as another electrode 3 or 4, is disposed between the adjacent electrodes 3 and 4. The number of such electrode pairs does not necessary be an integer but may be 1.5, 2.5, or other non-integer.

The center-to-center distance, that is, the pitch between the electrodes 3 and 4 is preferably greater than or equal to about 1 µm and less than or equal to about 10 µm, for example. The center-to-center distance between the electrodes 3 and 4 refers to the distance between the center of the width dimension of the electrode 3 in a direction orthogonal to the longitudinal direction of the electrode 3, and the center of the width dimension of the electrode 4 in a direction orthogonal to the longitudinal direction of the electrode 4.

Further, if at least one of the number of electrodes 3 and the number of electrodes 4 is more than one (i.e., if, with the electrode 3 and the electrode 4 defined as one pair of electrodes, there are 1.5 or more pairs of electrodes), the center-to-center distance between the electrodes 3 and 4 refers to the mean of the center-to-center distances of mutually adjacent electrodes 3 and 4 among the 1.5 or more pairs of electrodes 3 and 4.

The width of each of the electrodes 3 and 4, that is, the dimension of each of the electrodes 3 and 4 in a direction in which the electrodes 3 and 4 face each other is preferably greater than or equal to about 150 nm and less than or equal to about 1000 nm, for example. The center-to-center distance between the electrodes 3 and 4 refers to the distance between the center of the dimension (width dimension) of the electrode 3 in the direction orthogonal to the longitudinal direction of the electrode 3, and the center of the dimension (width dimension) of the electrode 4 in the direction orthogonal to the longitudinal direction of the electrode 4.

Since the piezoelectric layer according to the first preferred embodiment is a Z-cut piezoelectric layer, the direction orthogonal to the longitudinal direction of the electrodes 3 and 4 is a direction orthogonal to the polarization direction of the piezoelectric layer 2. This, however, does not hold if a piezoelectric with another cut-angle is used as the piezoelectric layer 2. As used herein, the term "orthogonal" may encompass not only strictly orthogonal but also substantially orthogonal (i.e., when the direction orthogonal to the longitudinal direction of the electrodes 3 and 4, and the polarization direction define an angle of, for example, about 90°±10°).

Figure 2:
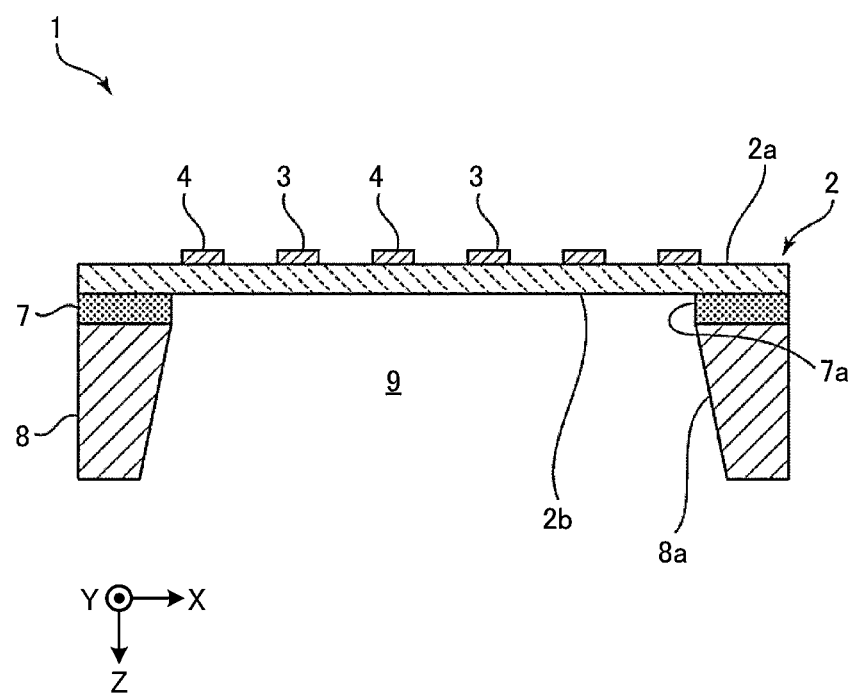
FIG. 2 is a cross-sectional view taken along a line II-II in FIG. 1A.

A support member 8 is stacked over the second major surface 2b of the piezoelectric layer 2 with an intermediate layer 7 interposed therebetween. The intermediate layer 7 and the support member 8 have a frame shape, and respectively have a cavity 7a and a cavity 8a as illustrated in FIG. 2. Due to the configuration mentioned above, a hollow (air gap) 9 is formed.

The hollow 9 is provided so that vibration of an excitation region C of the piezoelectric layer 2 is not prevented. Accordingly, the support member 8 extends over the second major surface 2b with the intermediate layer 7 interposed therebetween, at a location not overlapping an area where at least one pair of electrodes 3 and 4 is present. No intermediate layer 7 may be provided. Accordingly, the support member 8 can be stacked directly or indirectly over the second major surface 2b of the piezoelectric layer 2.

The intermediate layer 7 is an insulating layer, and made of silicon oxide. The intermediate layer 7 may, however, be made of any suitable insulating material other than silicon oxide, such as silicon oxynitride or alumina.

The support member 8 is also referred to as support substrate, and made of Si. The plane orientation of a face of Si near the piezoelectric layer 2 may be (100), or may be (110) or (111). Preferably, the Si used has a high resistivity greater than or equal to about 4 kΩ. It is to be noted, however, that the support member 8 may as well be made of any suitable insulating material or semiconductor material. Examples of suitable materials of the support member 8 may include piezoelectrics such as aluminum oxide, lithium tantalate, lithium niobate, and quartz, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The electrodes 3, the electrodes 4, the first busbar 5, and the second busbar 6 are each made of any suitable metal or alloy such as Al or AlCu alloy. According to the first preferred embodiment, each of the electrode 3, the electrode 4, the first busbar 5, and the second busbar 6 is a stack of an Al film over a Ti film. It is to be noted, however, that an adhesion layer other than a Ti film may be used.

In driving, an alternating-current voltage is applied between the electrodes 3 and the electrodes 4. More specifically, an alternating-current voltage is applied between the first busbar 5 and the second busbar 6. This makes it possible to provide resonance characteristics employing bulk waves in first-order thickness shear mode excited in the piezoelectric layer 2.

The acoustic wave device 1 is designed such that d/p is less than or equal to about 0.5, for example, where d is the thickness of the piezoelectric layer 2, and p is the center-to-center distance between any mutually adjacent electrodes 3 and 4 among a plurality of pairs of electrodes 3 and 4. This makes it possible to effectively excite the bulk waves in first-order thickness shear mode mentioned above, and consequently provide resonance characteristics. More preferably, d/p is less than or equal to about 0.24, for example, in which case further improved resonance characteristics can be provided.

It is to be noted that if at least one of the number of electrodes 3 and the number of electrodes 4 is more than one as with the first preferred embodiment, that is, if, with the electrode 3 and the electrode 4 defined as one pair of electrodes, there are 1.5 or more pairs of electrodes 3 and 4, the center-to-center distance p between mutually adjacent electrodes 3 and 4 refers to the mean of the center-to-center distances of the respective pairs of mutually adjacent electrodes 3 and 4.

The above-mentioned configuration of the acoustic wave device 1 according to the first preferred embodiment helps to reduce a decrease in Q-factor, even if the number of pairs of electrodes 3 and 4 is reduced to achieve miniaturization. This is because the resulting resonator does not require a reflector on each side, and thus has no insertion loss. The reason why no reflector is required as mentioned above is because bulk waves in first-order thickness shear mode are used.

Figure 3A:
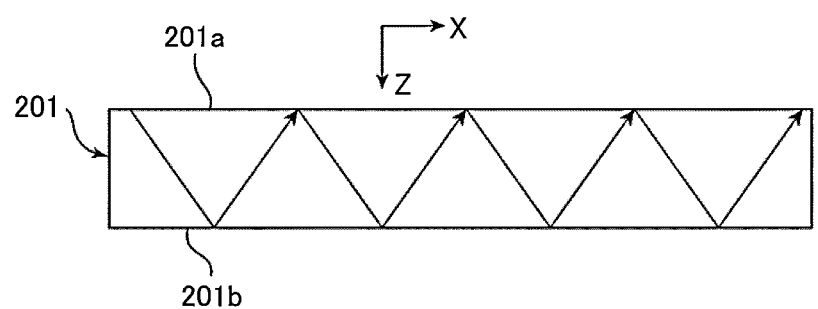
FIG. 3A is a schematic cross-sectional illustration for explaining Lamb waves propagating in a piezoelectric layer according to Comparative Example.
Figure 3B:
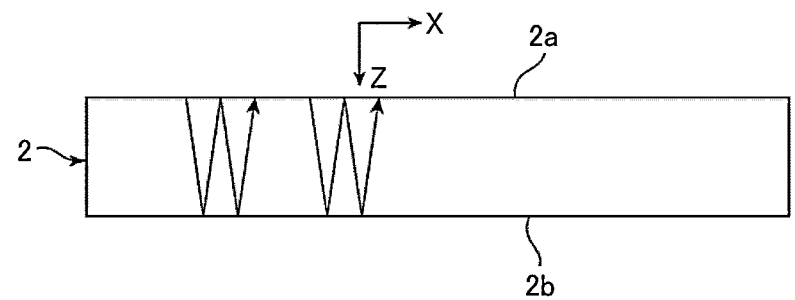
FIG. 3B is a schematic cross-sectional illustration for explaining bulk waves in first-order thickness shear mode that propagate in a piezoelectric layer according to the first preferred embodiment of the present invention.
Figure 4:
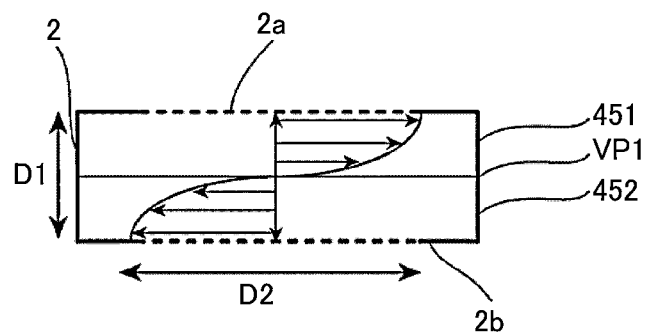
FIG. 4 is a schematic cross-sectional illustration for explaining the amplitude directions of bulk waves in first-order thickness shear mode that propagate in the piezoelectric layer according to the first preferred embodiment of the present invention.

FIG. 3A is a schematic cross-sectional illustration for explaining Lamb waves propagating in a piezoelectric layer according to Comparative Example. FIG. 3B is a schematic cross-sectional illustration for explaining bulk waves in first-order thickness shear mode that propagate in the piezoelectric layer according to the first preferred embodiment. FIG. 4 is a schematic cross-sectional illustration for explaining the amplitude directions of bulk waves in first-order thickness shear mode that propagate in the piezoelectric layer according to the first preferred embodiment.

FIG. 3A illustrates an acoustic wave device like the one described in Japanese Unexamined Patent Application Publication No. 2012-257019, with Lamb waves propagating in the piezoelectric layer. As illustrated in FIG. 3A, the waves propagate within a piezoelectric layer 201 as indicated by arrows. The piezoelectric layer 201 has a first major surface 201a, and a second major surface 201b. The thickness direction connecting the first major surface 201a and the second major surface 201b is defined as the Z-direction. The X-direction refers to a direction in which the fingers of an interdigital transducer (IDT) electrode are arranged. As illustrated in FIG. 3A, Lamb waves propagate in the X-direction. Although the piezoelectric layer 201 vibrates as a whole due to the Lamb waves being plate waves, since the waves propagate in the X-direction, a reflector is disposed on each side to provide resonance characteristics. This results in wave propagation loss. Therefore, an attempt for miniaturization, that is, a reduction in the number of pairs of electrode fingers results in a decrease in Q-factor.

By contrast, with the acoustic wave device according to the first preferred embodiment, vibration displacement occurs in the thickness shear direction as illustrated in FIG. 3B. This results in the waves propagating substantially in the direction connecting the first major surface 2a and the second major surface 2b of the piezoelectric layer 2, that is, in the Z-direction, to achieve resonance. That is, the waves have an extremely small X-direction component relative to their Z-direction component. Since the wave propagation in the Z-direction provides the resonance characteristics, no reflector is required. This means that no propagation loss due to wave propagation through the reflector occurs. This helps to reduce a decrease in Q-factor, even if the number of pairs of electrodes 3 and 4 is reduced in an attempt to achieve further miniaturization.

As illustrated in FIG. 4, the amplitude direction of bulk waves in first-order thickness shear mode is opposite between a first region 451 and a second region 452, which are included in the excitation region C of the piezoelectric layer 2 (see FIG. 1B). FIG. 4 schematically illustrates bulk waves generated upon application of a voltage between the electrode 3 and the electrode 4 such that the electrode 4 is at a higher potential than the electrode 3. The first region 451 is a portion of the excitation region C located between a virtual plane VP1 and the first major surface 2a, the virtual plane VP1 being orthogonal to the thickness direction of the piezoelectric layer 2 and dividing the piezoelectric layer 2 into two regions. The second region 452 is a portion of the excitation region C located between the virtual plane VP1 and the second major surface 2b.

As described above, the acoustic wave device 1 includes at least one pair of electrodes including the electrode 3 and the electrode 4. Since the acoustic wave device 1 is not designed for wave propagation in the X-direction, the acoustic wave device 1 does not necessarily need to include a plurality of such electrode pairs each including the electrode 3 and the electrode 4. That is, the acoustic wave device 1 may simply include at least one pair of electrodes.

For example, the electrode 3 is an electrode to be connected with a hot potential, and the electrode 4 is an electrode to be connected with a ground potential. Alternatively, however, the electrode 3 may be connected with a ground potential, and the electrode 4 may be connected with a hot potential. According to the first preferred embodiment, at least one pair of electrodes includes an electrode to be connected with a hot potential or an electrode to be connected with a ground potential as described above, and no floating electrode is provided.

Figure 5:
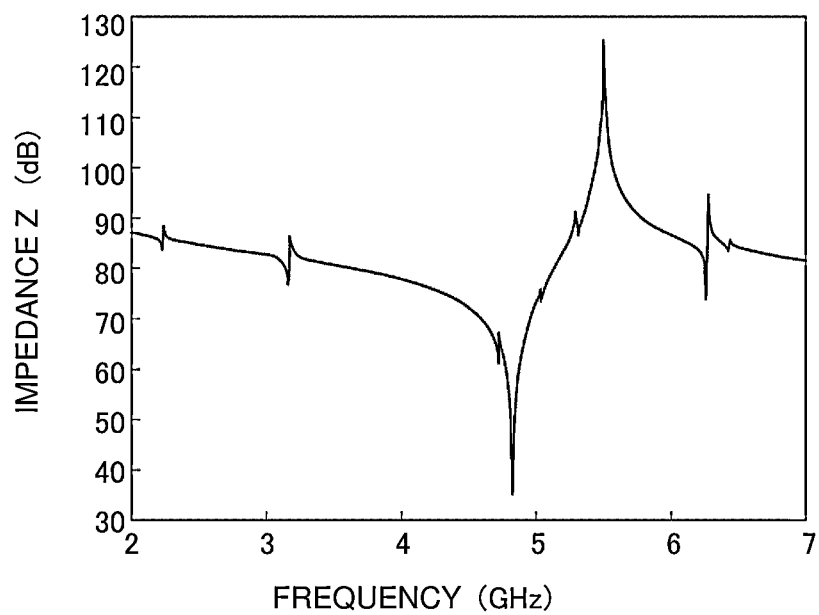
FIG. 5 illustrates an example of the resonance characteristics of the acoustic wave device according to the first preferred embodiment of the present invention.

FIG. 5 illustrates an example of the resonance characteristics of the acoustic wave device according to the first preferred embodiment. The acoustic wave device 1 with the resonance characteristics illustrated in FIG. 5 has design parameters described below.

Piezoelectric layer 2: LiNbO$_3$ with Euler angles (0°, 0°, 90°)

Thickness of piezoelectric layer 2: 400 nm

Length of excitation region C (see FIG. 1B): 40 μm

Number of electrode pairs each including the electrode 3 and the electrode 4: 21

Center-to-center distance (pitch) p between electrodes 3 and 4: 3 μm

Width of electrodes 3 and 4: 500 nm d/p: 0.133

Intermediate layer 7: silicon oxide film with thickness of 1 μm

Support member 8: Si

The excitation region C (see FIG. 1B) refers to a region where the electrodes 3 and 4 overlap each other when viewed in the X-direction, which is a direction orthogonal to the longitudinal direction of the electrodes 3 and 4. The length of the excitation region C refers to a dimension of the excitation region C in the longitudinal direction of the electrodes 3 and 4.

According to the first preferred embodiment, the center-to-center distance is set equal or substantially equal between all pairs of electrodes 3 and 4. That is, the electrodes 3 and 4 are disposed at equal or substantially equal pitches.

As can be appreciated from FIG. 5, improved resonance characteristics with a fractional band width of about 12.5% are obtained, even though no reflector is provided.

According to the first preferred embodiment, d/p is less than or equal to about 0.5, more preferably less than or equal to about 0.24, for example, where d is the thickness of the piezoelectric layer 2, and p is the center-to-center distance between the electrode 3 and the electrode 4. This is explained below with reference to FIG. 6.

Figure 6:
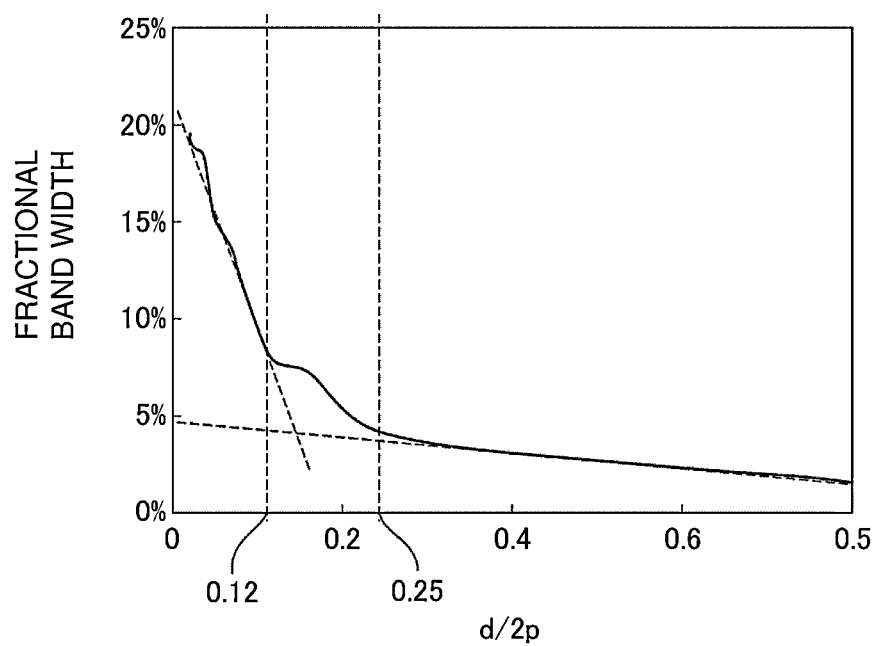
FIG. 6 illustrates, for the acoustic wave device according to the first preferred embodiment of the present invention, the relationship between d/2p, and the fractional band width of the acoustic wave device serving as a resonator, where p is the center-to-center distance between mutually adjacent electrodes or the mean center-to-center distance, and d is the mean thickness of the piezoelectric layer.

A plurality of acoustic wave devices are obtained in the same manner as with the acoustic wave device having the resonant characteristics illustrated in FIG. 5, but with varying values of d/2p. FIG. 6 illustrates, for the acoustic wave device according to the first preferred embodiment, the relationship between d/2p, and the fractional band width of the acoustic wave device serving as a resonator, where p is the center-to-center distance between mutually adjacent electrodes or the mean center-to-center distance, and d is the mean thickness of the piezoelectric layer.

As illustrated in FIG. 6, when d/2p exceeds about 0.25, that is, when d/p>about 0.5, the fractional band width remains below about 5% even as d/p is adjusted. By contrast, when d/2p≤about 0.25, that is, when d/p≤about 0.5, varying d/p within this range makes it possible to provide a fractional band width of greater than or equal to about 5%, that is, a resonator with a high coupling coefficient. When d/2p is less than or equal to about 0.12, that is, when d/p is less than or equal to about 0.24, the fractional band width can be increased to be greater than or equal to about 7%. In addition, adjusting d/p within this range makes it possible to provide a resonator with an even greater fractional band width, and consequently with an even higher coupling coefficient. It can therefore be appreciated that setting d/p less than or equal to about 0.5, for example, makes it possible to provide a resonator with a high coupling coefficient that employs the bulk waves in first-order thickness shear mode mentioned above.

It is to be noted that the at least one pair of electrodes mentioned above may be one pair of electrodes, in which case the value of p mentioned above is the center-to-center distance between mutually adjacent electrodes 3 and 4. If there are 1.5 or more pairs of electrodes, the mean of the center-to-center distances of mutually adjacent electrodes 3 and 4 may be defined as p.

For example, if the piezoelectric layer 2 has thickness variations, its averaged thickness may be used.

Figure 7:
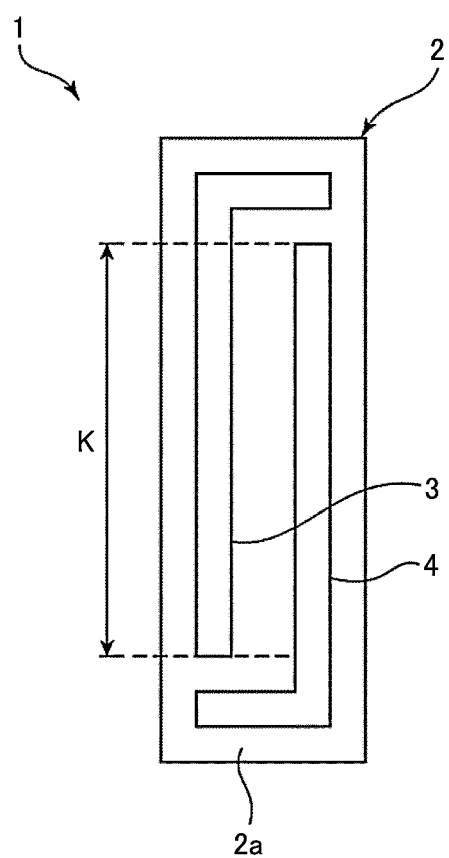
FIG. 7 is a plan view of an example of the acoustic wave device according to the first preferred embodiment of the present invention that includes one pair of electrodes.

FIG. 7 is a plan view of an example of the acoustic wave device according to the first preferred embodiment that includes one pair of electrodes. The acoustic wave device 1 includes one pair of electrodes 3 and 4 extending over the first major surface 2a of the piezoelectric layer 2. In FIG. 7, K represents intersecting width. As previously mentioned, the acoustic wave device according to the present disclosure may include one pair of electrodes. In this case as well, bulk waves in first-order thickness shear mode can be effectively excited if the value of d/p mentioned above is less than or equal to about 0.5, for example.

Figure 8:
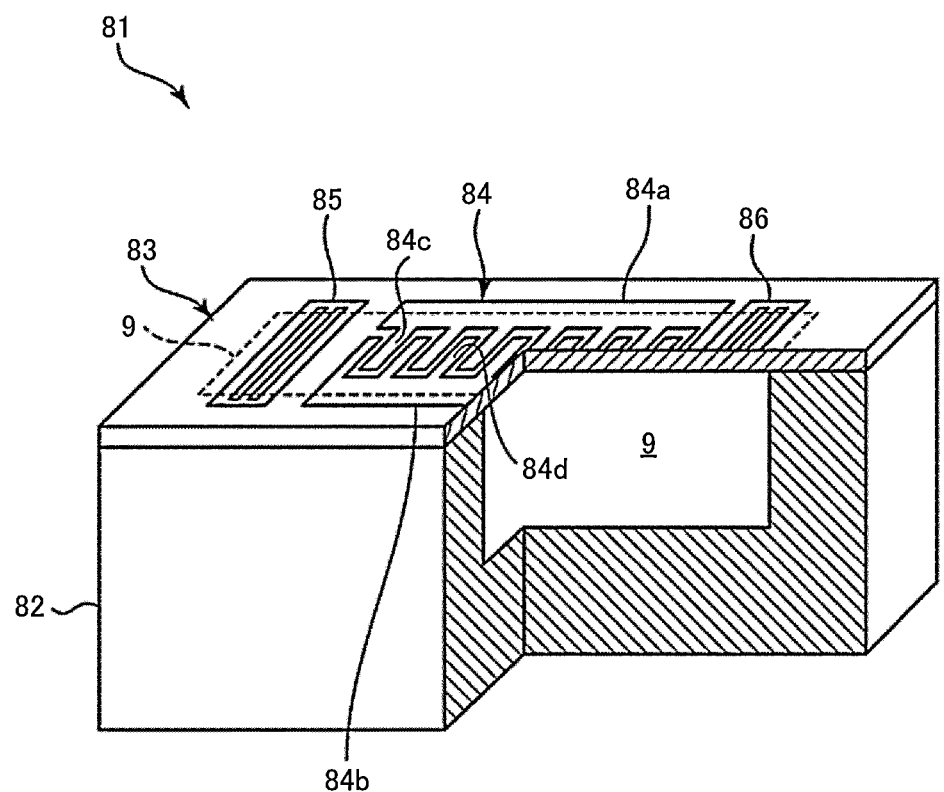
FIG. 8 is a partially cut-away perspective view of an acoustic wave device according to a modification of the first preferred embodiment of the present invention.

FIG. 8 is a partially cut-away perspective view of an acoustic wave device according to a modification of the first preferred embodiment. An acoustic wave device 81 includes a support substrate 82. The support substrate 82 has a recess that opens at the top. A piezoelectric layer 83 is stacked over the support substrate 82. Due to the configuration mentioned above, the hollow 9 in the support substrate 82 is formed. An IDT electrode 84 is disposed above the hollow 9 and over the piezoelectric layer 83. Reflectors 85 and 86 are disposed beside opposite sides of the IDT electrode 84 in the direction of acoustic wave propagation. In FIG. 8, the peripheral edges of the hollow 9 are represented by broken lines. In this case, the IDT electrode 84 includes a first busbar 84a, a second busbar 84b, a plurality of electrodes 84c serving as first electrode fingers, and a plurality of electrodes 84d serving as second electrode fingers. The electrodes 84c are connected with the first busbar 84a. The electrodes 84d are connected with the second busbar 84b. Each electrode 84c and each electrode 84d are interdigitated with each other.

In the acoustic wave device 81, Lamb waves, which are plate waves, are excited through application of an alternating-current electric field to the IDT electrode 84 extending over the hollow 9. The presence of the reflectors 85 and 86 beside opposite sides of the IDT electrode 84 makes it possible to provide resonance characteristics due to the Lamb waves.

Figure 9:
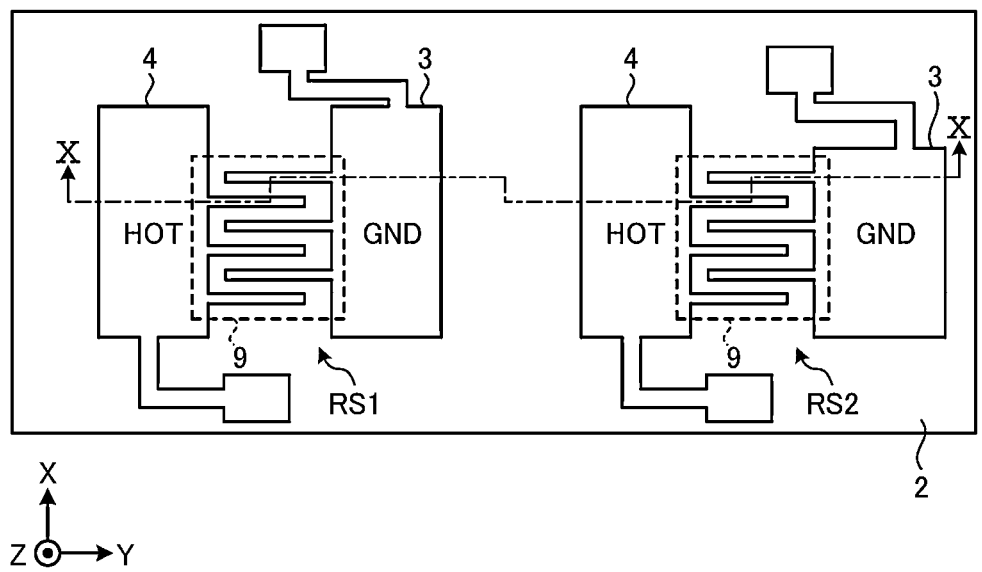
FIG. 9 is a plan view of an acoustic wave device according to Comparative Example.
Figure 10:
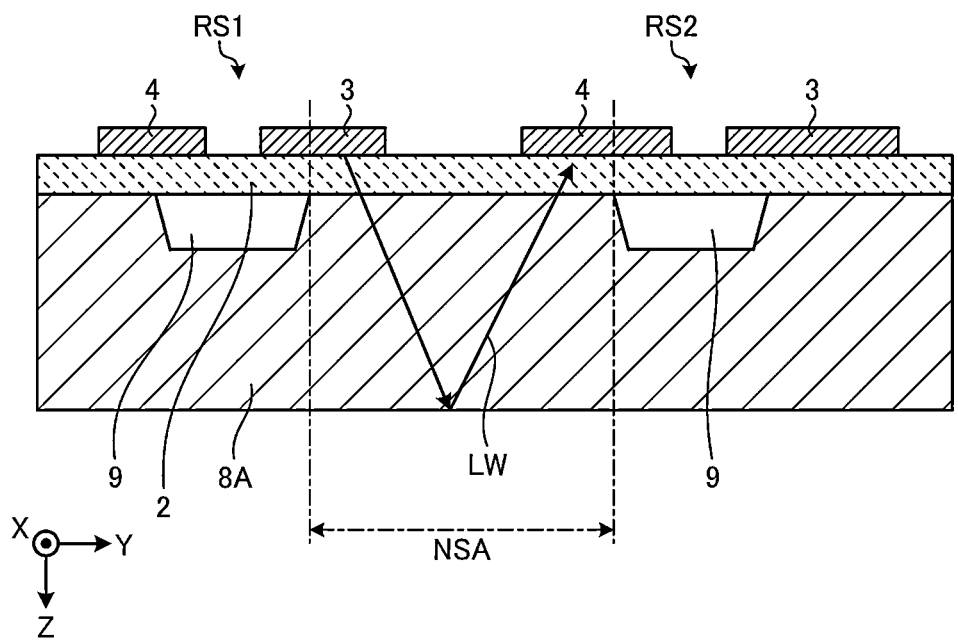
FIG. 10 is a cross-sectional view taken along a line X-X in FIG. 9.

FIG. 9 is a plan view of an acoustic wave device according to Comparative Example. FIG. 10 is a cross-sectional view taken along a line X-X in FIG. 9. As illustrated in FIGS. 9 and 10, in the acoustic wave device according to Comparative Example, a single support member 8A supports a first resonator RS1 and a second resonator RS2.

The acoustic wave device illustrated in FIGS. 9 and 10 includes the support member 8A, and a piezoelectric layer with the first major surface 2a and the second major surface 2b. Electrodes extend over the first major surface 2a, and hollows 9A and 9B are located near the second major surface 2b. Over the piezoelectric layer 2, the first electrode 3 of the first resonator RS1, and the second electrode 4 of the second resonator RS2, which are electrodes at mutually different potentials, are disposed with a non-overlap region NSA interposed therebetween, the non-overlap region NSA not overlapping the hollows 9A and 9B as seen in plan view in the Z-direction.

Figure 11A:
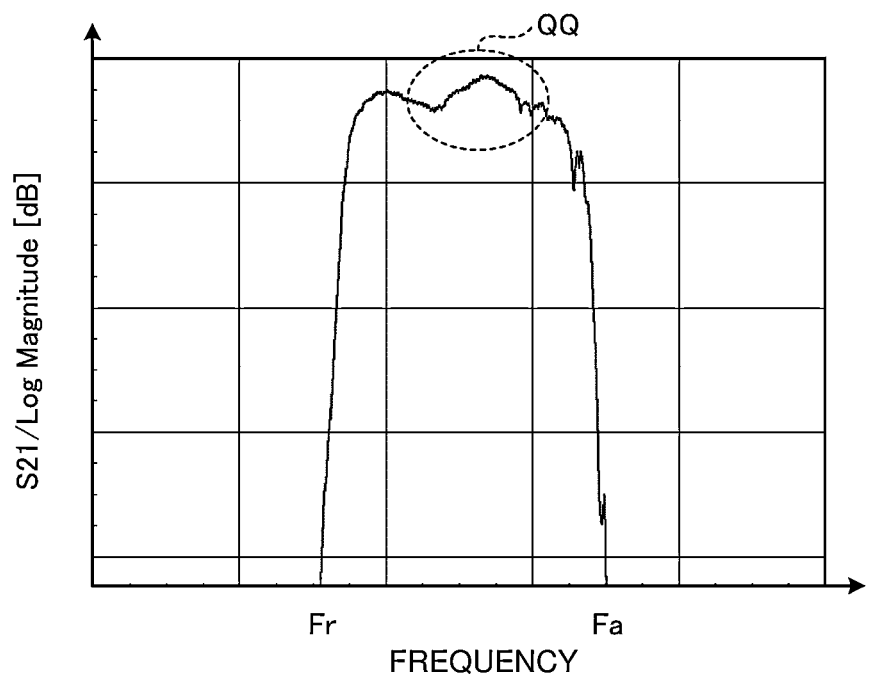
FIG. 11A is an illustration for explaining frequency characteristics according to Comparative Example.
Figure 11B:
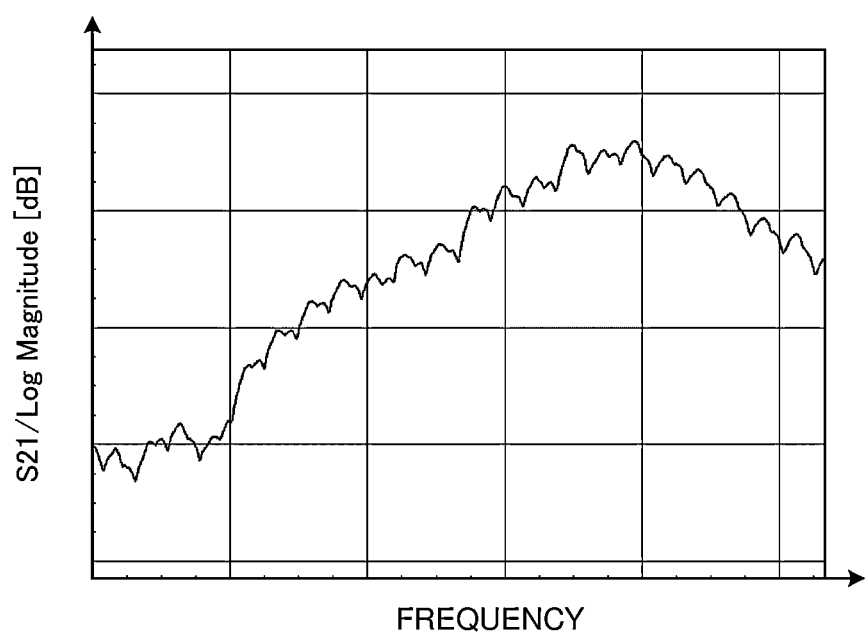
FIG. 11B is an illustration for explaining a portion of the frequency characteristics illustrated in FIG. 11A.

For example, a leaky wave LW due to leakage of a wave excited by the electrode 3 of the first resonator RS1 may potentially be reflected by the support member 8A and propagate to the electrode 4 of the second resonator RS2. FIG. 11A is an illustration for explaining frequency characteristics according to Comparative Example. FIG. 11B is an illustration for explaining part of the frequency characteristics illustrated in FIG. 11A. In FIGS. 11A and 11B, the vertical axis represents bandpass characteristics [dB], and the horizontal axis represents frequency. A band of frequencies between a resonant frequency Fr and an anti-resonant frequency Fa, which are illustrated in FIG. 11A, is herein referred to as pass band. FIG. 11B is an enlarged illustration of a pass band QQ illustrated in FIG. 11A. Within the pass band in FIGS. 11A and 11B, insertion loss is depicted, and outside the pass band in FIG. 11A, attenuation is depicted.

As illustrated in FIG. 11B, the acoustic wave device according to Comparative Example has a large number of ripples in the filter pass band QQ due to the leaky wave LW. This can lead to degradation of filter characteristics.

Figure 12:
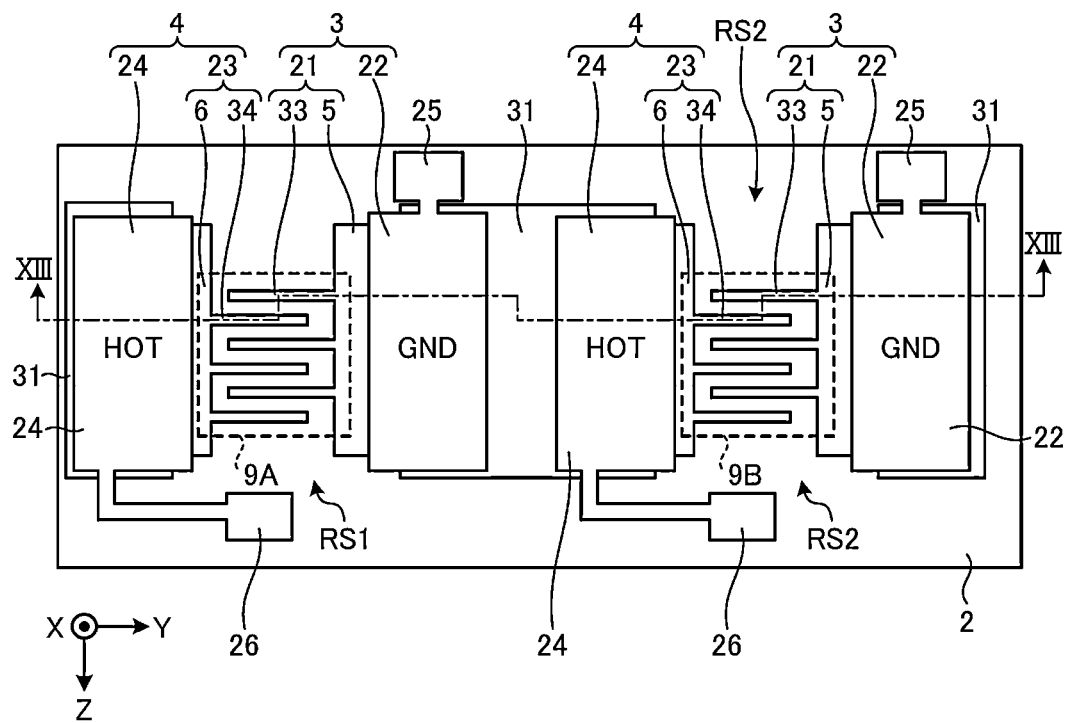
FIG. 12 is a plan view of the acoustic wave device according to the first preferred embodiment of the present invention.
Figure 13:
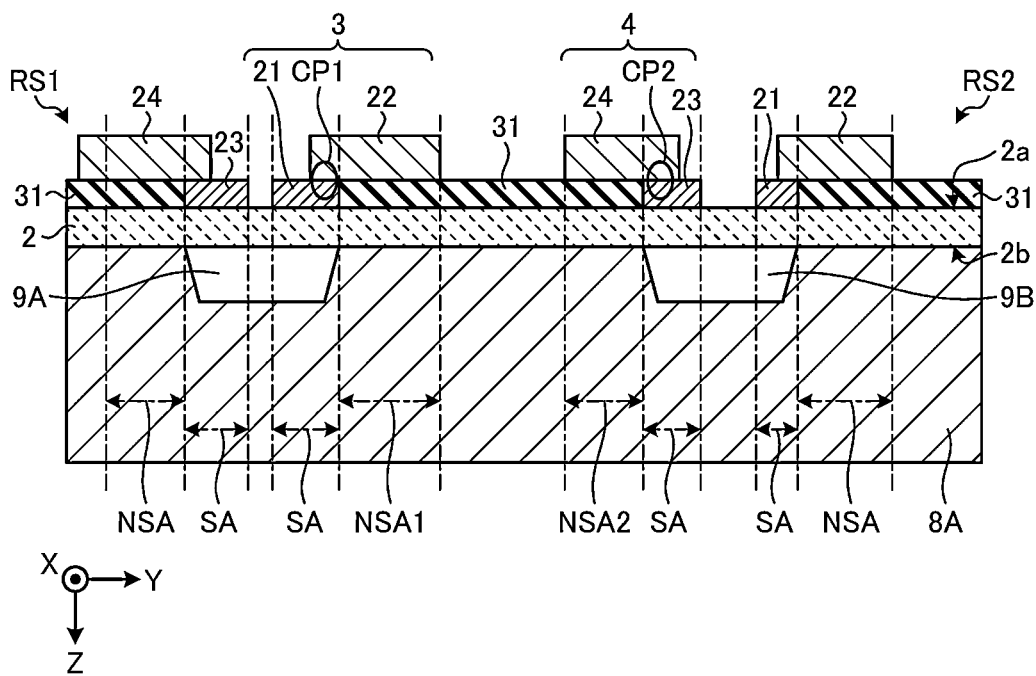
FIG. 13 is a cross-sectional view taken along a line XIII-XIII in FIG. 12.

FIG. 12 is a plan view of the acoustic wave device according to the first preferred embodiment. FIG. 13 is a cross-sectional view taken along a line XIII-XIII in FIG. 12. As illustrated in FIGS. 12 and 13, in the acoustic wave device according to the first preferred embodiment, a single support member 8A supports the first resonator RS1 and the second resonator RS2. The second resonator RS2 is at a location different from that of the first resonator RS1.

The acoustic wave device illustrated in FIGS. 12 and 13 includes the support member 8A, and the piezoelectric layer 2 with the first major surface 2a and the second major surface 2b. The first electrode 3 and the second electrode 4 extend over the first major surface 2a, and the hollows 9A and 9B are located near the second major surface 2b. The hollow 9B is disposed in the Y-direction relative to the hollow 9A. One of the first electrode 3 of the first resonator RS1, and the second electrode 4 of the second resonator RS2 is a hot electrode, and the other is a ground electrode. The first electrode 3 of the first resonator RS1, and the second electrode 4 of the second resonator RS2 have mutually different potentials. According to the first preferred embodiment, the first electrode 3 of the first resonator RS1 is a ground electrode, and the second electrode 4 of the second resonator RS2 is a hot electrode.

Over the first major surface 2a of the piezoelectric layer 2, the first electrode 3 of the first resonator RS1, and the second electrode 4 of the second resonator RS2 are disposed with the non-overlap region NSA interposed therebetween, the non-overlap region NSA not overlapping the hollows 9A and 9B as seen in plan view in the Z-direction. As seen in the Z-direction, the first electrode 3 of the first resonator RS1, and the second electrode 4 of the second resonator RS2 each extend over an overlap region SA, which overlaps the hollow 9A or 9B, and the non-overlap region NSA, which does not overlap the hollow 9A or 9B.

As illustrated in FIG. 12, the first electrode 3 includes a plurality of electrode fingers 33, a first busbar 5, and a wiring layer 22. The electrode fingers 33 extend in the Y-direction. The first busbar 5 is connected with the electrode fingers 33. The wiring layer 22 is connected with an electrode terminal 25. The second electrode 4 includes a plurality of electrode fingers 34, a second busbar 6, and a wiring layer 24. The electrode fingers 34 extend in the Y-direction. The second busbar 6 is connected with the electrode fingers 34. The wiring layer 24 is connected with an electrode terminal 26. Each of the first electrode 3 and the second electrode 4 defines a functional electrode, and is also called an IDT electrode.

In the first electrode 3 of the first resonator RS1, the electrode fingers 33 extending over the first major surface 2a of the piezoelectric layer 2, and the first busbar 5 correspond to a first portion 21. The wiring layer 22 corresponds to a second portion that is disposed at least partially over the first portion 21, and that connects with the first portion 21. A connection portion CP1, which defines at least a portion of the first electrode 3 and connects the first portion 21 and the wiring layer 22, is disposed in the overlap region SA as seen in the Z-direction. As seen in the Z-direction, a portion of the wiring layer 22 excluding the connection portion CP overlaps the non-overlap region NSA.

In the second electrode 4 of the second resonator RS2, the electrode fingers 34 extending over the first major surface 2a of the piezoelectric layer 2, and the second busbar 6 correspond to a first portion 23. The wiring layer 24 corresponds to a second portion that is disposed at least partially over the first portion 23, and that connects with the first portion 23. A connection portion CP2, which defines at least a portion of the second electrode 4 and connects the first portion 23 and the wiring layer 24, is disposed in the overlap region SA as seen in the Z-direction. As seen in the Z-direction, a portion of the wiring layer 24 excluding the connection portion CP2 overlaps the non-overlap region NSA.

As illustrated in FIGS. 12 and 13, in the non-overlap region NSA, an insulating film 31 is interposed between the piezoelectric layer 2, and each of the wiring layer 22 of the first resonator RS1 and the wiring layer 24 of the second resonator RS2. The insulating film 31 is one of silicon oxide, silicon nitride, and resin. The resin to be used is not particularly limited as long as the resin is insulating. Examples of such resin may include polyimide resin and epoxy resin.

Although not particularly limited, the thickness of the insulating film 31 is preferably greater than or equal to about 500 nm and less than or equal to about 3000 nm, for example, from the viewpoint of the deposition accuracy when the electrode 3 or the electrode 4 is positioned adjacent to the insulating film 31. If the insulating film 31 is present in the overlap region SA, this would cause a change in electromechanical coupling coefficient, and consequently affect the filter characteristics within the pass band. For this reason, preferably, the insulating film 31 is not provided in the overlap region SA. In the overlap region SA, the first electrode 3 and the second electrode 4, which are functional electrodes, are in contact with the first major surface of the piezoelectric layer 2.

As described above, the acoustic wave device according to the first preferred embodiment includes the support member 8A corresponding to a support substrate, the piezoelectric layer 2 that, as seen in the Z-direction of the support member 8A, overlaps the support member 8A, and the first electrode 3 and the second electrode 4. The first electrode 3 and the second electrode 4 extend over the first major surface 2a of the piezoelectric layer 2, face each other in the X-direction that crosses the Z-direction, and have mutually different potentials. The hollow 9A and the hollow 9B, which are disposed in the support member 8A, are spaces located near the second major surface 2b of the piezoelectric layer 2. The hollow 9A and the hollow 9B are covered by the piezoelectric layer 2. As seen in the Z-direction, the first electrode 3 extends over the overlap region SA that overlaps the hollow 9A, and the non-overlap region NSA that does not overlap the hollow 9A. As seen in the Z-direction, the second electrode 4 extends over the overlap region SA that overlaps the hollow 9B, and the non-overlap region NSA that does not overlap the hollow 9B. In the non-overlap region NSA of the first electrode 3, the insulating film 31 is disposed between the first electrode 3 and the piezoelectric layer 2. In the non-overlap region NSA of the second electrode 4, the insulating film 31 is disposed between the second electrode 4 and the piezoelectric layer 2.

The presence of the insulating film 31 helps to reduce a leaky wave LW that emanates from the non-overlap region NSA of the first electrode 3 and the non-overlap region NSA of the second electrode 4. The presence of the insulating film 31 also helps to reduce the possibility of the leaky wave LW reaching the non-overlap region NSA of the first electrode 3 or the non-overlap region NSA of the second electrode 4. This leads to reduced ripples in the filter pass band QQ, and consequently reduced degradation of filter characteristics.

Figure 14:
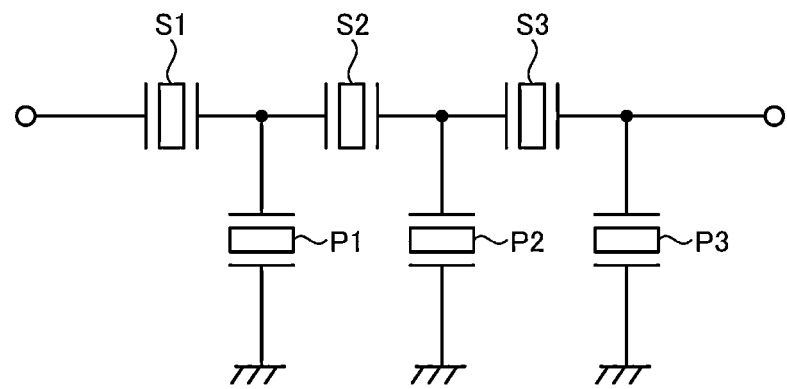
FIG. 14 is an illustration for explaining a filter including the acoustic wave device according to the first preferred embodiment of the present invention.

FIG. 14 is an illustration for explaining a filter including the acoustic wave device according to the first preferred embodiment. The filter illustrated in FIG. 14 is a ladder filter circuit including a plurality of resonators S1, S2, S3, P1, P2, and P3 that each have unique resonant and anti-resonant frequencies, and that are connected in a ladder configuration so as to pass signals in a predetermined frequency band and attenuate signals in other frequency bands.

The first resonator RS1 mentioned above is one of the resonators S1, S2, and S3 in the series arm, and the second resonator RS2 is one of the resonators P1, P2, and P3 in the parallel arm. Alternatively, each of the first resonator RS1 and the second resonator RS2 may be one of the resonators S1, S2, S3, P1, P2, and P3.

Figure 15:
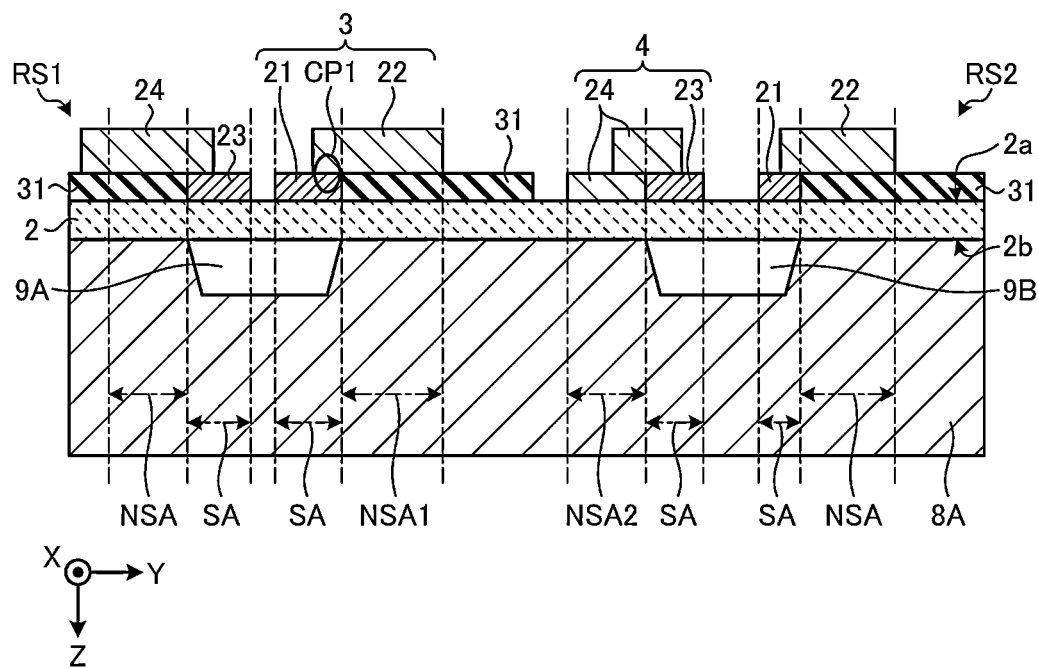
FIG. 15 is a cross-sectional view of an acoustic wave device according to a first modification of the first preferred embodiment of the present invention.

FIG. 15 is a cross-sectional view of an acoustic wave device according to a first modification of the first preferred embodiment. According to the first modification of the first preferred embodiment, as seen in the Z-direction, the first electrode 3 extends over the overlap region SA that overlaps the hollow 9A, and a non-overlap region NSA1 that does not overlap the hollow 9A. As seen in the Z-direction, the second electrode 4 extends over the overlap region SA that overlaps the hollow 9B, and a non-overlap region NSA2 that does not overlap the hollow 9B. In the non-overlap region NSA1 of the first electrode 3, the insulating film 31 is disposed between the first electrode 3 and the piezoelectric layer 2. In the non-overlap region NSA2 of the first electrode 3, the insulating film 31 is not disposed between the second electrode 4 and the piezoelectric layer 2. The connection portion CP1, which defines at least a portion of the first electrode 3 and connects the first portion 21 and the wiring layer 22, is disposed in the overlap region SA as seen in the Z-direction. As seen in the Z-direction, a portion of the wiring layer 22 excluding the connection portion CP1 overlaps the non-overlap region NSA1.

A first area, which is the area of the first electrode 3 in the non-overlap region NSA1 of the first resonator RS1 illustrated in FIG. 15, is larger than a second area, which is the area of the second electrode 4 in the non-overlap region NSA2 of the second resonator RS2. The insulating film 31 is present in the non-overlap region NSA1, which is the non-overlap region of the electrode with the relatively larger one of the first area and the second area, whereas the insulating film 31 is not present in the non-overlap region NSA2, which is the non-overlap region of the electrode with the relatively smaller one of the first area and the second area. The electrode with the relatively larger one of the first area and second area is also the one susceptible to greater vibration due to excitation. In the acoustic wave device according to the first modification of the first preferred embodiment, the insulating film 31 is present in the non-overlap area NSA1 of the electrode with the relatively larger one of the first area and the second area as described above. This helps to reduce vibration of the electrode, and consequently reduce degradation of filter characteristics.

Figure 16:
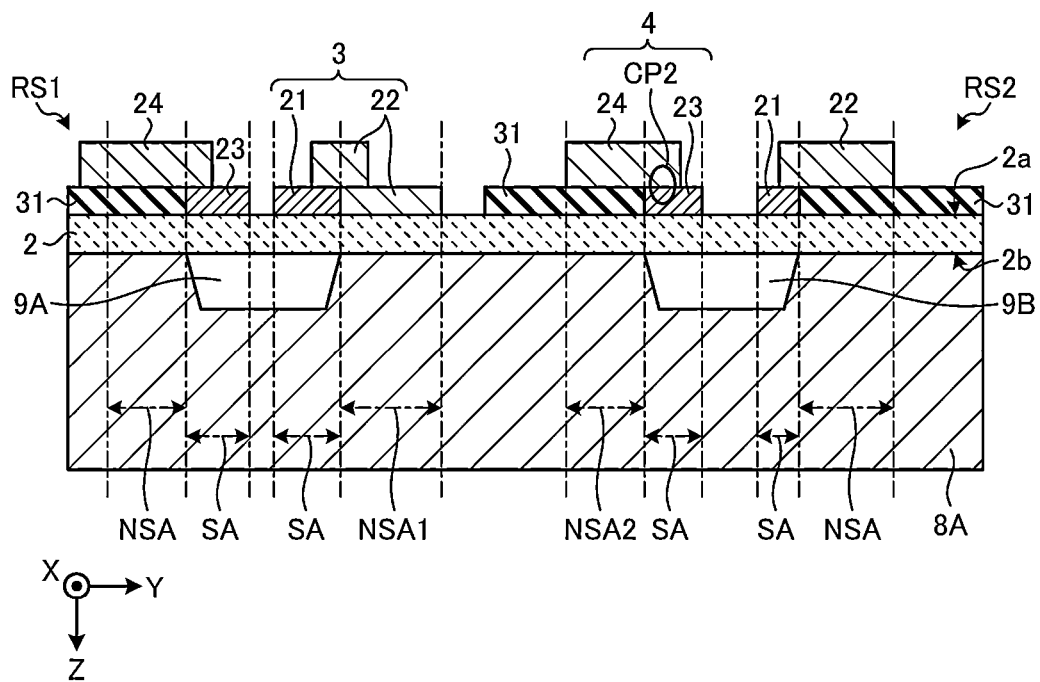
FIG. 16 is a cross-sectional view of an acoustic wave device according to a second modification of the first preferred embodiment of the present invention.

FIG. 16 is a cross-sectional view of an acoustic wave device according to a second modification of the first preferred embodiment. According to the second modification of the first preferred embodiment, as seen in the Z-direction, the first electrode 3 extends over the overlap region SA that overlaps the hollow 9A, and the non-overlap region NSA1 that does not overlap the hollow 9A. As seen in the Z-direction, the second electrode 4 extends over the overlap region SA that overlaps the hollow 9B, and the non-overlap region NSA2 that does not overlap the hollow 9B. In the non-overlap region NSA1 of the first electrode 3, the insulating film 31 is not disposed between the first electrode 3 and the piezoelectric layer 2. In the non-overlap region NSA2 of the second electrode 4, the insulating film 31 is disposed between the second electrode 4 and the piezoelectric layer 2. The connection portion CP2, which defines at least a portion of the second electrode 4 and connects the first portion 23 and the wiring layer 24, is disposed in the overlap region SA as seen in the Z-direction. As seen in the Z-direction, a portion of the wiring layer 24 excluding the connection portion CP2 overlaps the non-overlap region NSA2.

A first area, which is the area of the first electrode 3 in the non-overlap region NSA1 of the first resonator RS1 illustrated in FIG. 16, is larger than a second area, which is the area of the second electrode 4 in the non-overlap region NSA2 of the second resonator RS2. The insulating film 31 is not present in the non-overlap region NSA1, which is the non-overlap region of the electrode with the relatively larger one of the first area and the second area, whereas the insulating film 31 is present in the non-overlap region NSA2, which is the non-overlap region of the electrode with the relatively smaller one of the first area and the second area. A leaky wave LW is more likely to propagate to the electrode with the relatively smaller one of the first area and the second area. In the acoustic wave device according to the second modification of the first preferred embodiment, the insulating film 31 is present in the non-overlap area NSA2 of the electrode with the relatively smaller one of the first area and the second area as described above. This helps to reduce the possibility of the leaky wave LW reaching the electrode, and consequently reduce degradation of filter characteristics.

Second Preferred Embodiment

Figure 17:
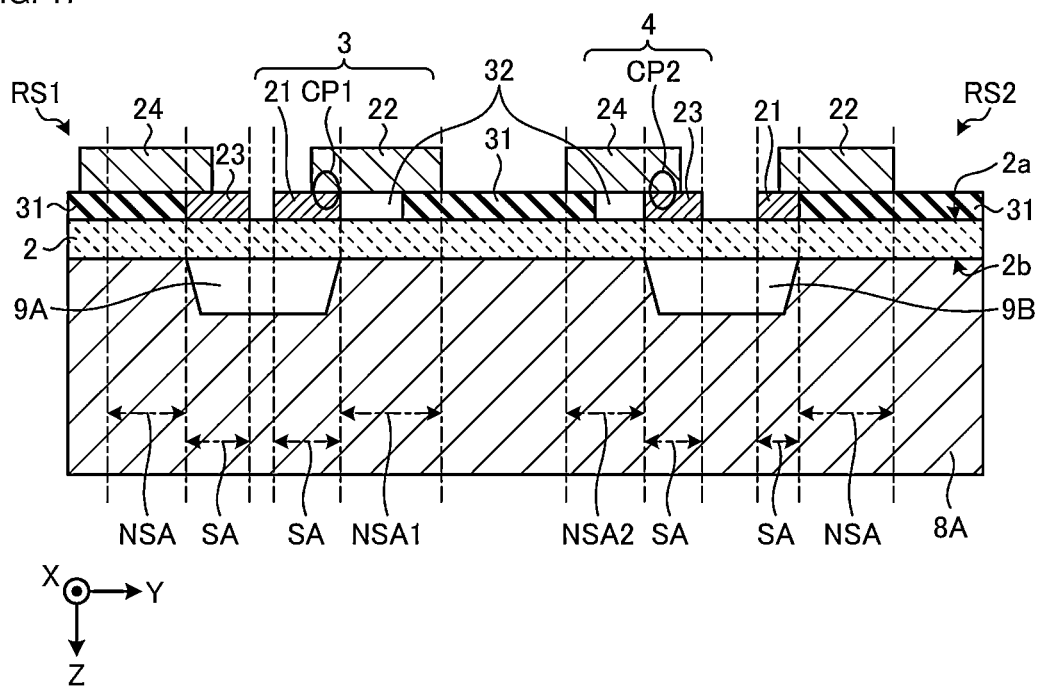
FIG. 17 is a cross-sectional view of an acoustic wave device according to a second preferred embodiment of the present invention.

FIG. 17 is a cross-sectional view of an acoustic wave device according to a second preferred embodiment. FIG. 17 illustrates another cross-section taken along the line XIII-XIII in FIG. 12. In the acoustic wave device according to the second preferred embodiment, a single support member 8A supports the first resonator RS1 and the second resonator RS2. The second resonator RS2 is at a location different from that of the first resonator RS1. Features according to the second preferred embodiment that are identical to those according to the first preferred embodiment will be designated by the same reference signs and will not be described in further detail.

As seen in the Z-direction, the first electrode 3 extends over the overlap region SA that overlaps the hollow 9A, and the non-overlap region NSA1 that does not overlap the hollow 9A. As seen in the Z-direction, the second electrode 4 extends over the overlap region SA that overlaps the hollow 9B, and the non-overlap region NSA2 that does not overlap the hollow 9B. In the non-overlap region NSA1 of the first electrode 3, the insulating film 31 and a void 32 are disposed between the first electrode 3 and the piezoelectric layer 2. The void 32 in the non-overlap region NSA1 is surrounded by the first portion 21, the insulating film 31, the piezoelectric layer 2, and the wiring layer 22, which corresponds to a second portion. In the non-overlap region NSA2 of the second electrode 4, the insulating film 31 and the void 32 are disposed between the second electrode 4 and the piezoelectric layer 2. The void 32 in the non-overlap region NSA2 is surrounded by the first portion 23, the insulating film 31, the piezoelectric layer 2, and the wiring layer 24, which corresponds to a second portion.

The connection portion CP1, which defines at least a portion of the first electrode 3 and connects the first portion 21 and the wiring layer 22, is disposed in the overlap region SA as seen in the Z-direction. As seen in the Z-direction, a portion of the wiring layer 22 excluding the connection portion CP1 overlaps the non-overlap region NSA1. The connection portion CP2, which defines at least a portion of the second electrode 4 and connects the first portion 23 and the wiring layer 24, is disposed in the overlap region SA as seen in the Z-direction. As seen in the Z-direction, a portion of the wiring layer 24 excluding the connection portion CP2 overlaps the non-overlap region NSA2.

As described above, the acoustic wave device according to the second preferred embodiment includes the support member 8A corresponding to a support substrate, the piezoelectric layer 2 that, as seen in the Z-direction of the support member 8A, overlaps the support member 8A, and the first electrode 3 and the second electrode 4. The first electrode 3 and the second electrode 4 extend over the first major surface 2a of the piezoelectric layer 2, face each other in the X-direction that crosses the Z-direction, and have mutually different potentials. The hollow 9A and the hollow 9B are spaces located near the second major surface 2b of the piezoelectric layer 2. The hollow 9A and the hollow 9B are covered by the piezoelectric layer 2. As seen in the Z-direction, the first electrode 3 extends over the overlap region SA that overlaps the hollow 9A, and the non-overlap region NSA1 that does not overlap the hollow 9A. As seen in the Z-direction, the second electrode 4 extends over the overlap region SA that overlaps the hollow 9B, and the non-overlap region NSA2 that does not overlap the hollow 9B. In the non-overlap region NSA1 of the first electrode 3, the void 32 is disposed between the first electrode 3 and the piezoelectric layer 2. In the non-overlap region NSA2 of the second electrode 4, the void 32 is disposed between the second electrode 4 and the piezoelectric layer 2.

The presence of the void 32 helps to reduce a leaky wave LW that emanates from the non-overlap region NSA1 of the first electrode 3 and the non-overlap region NSA2 of the second electrode 4. The presence of the insulating film 31 also helps to reduce the possibility of the leaky wave LW reaching the non-overlap region NSA1 of the first electrode 3 or the non-overlap region NSA2 of the second electrode 4. This leads to reduced ripples in the filter pass band QQ, and consequently reduced degradation of filter characteristics.

Figure 18:
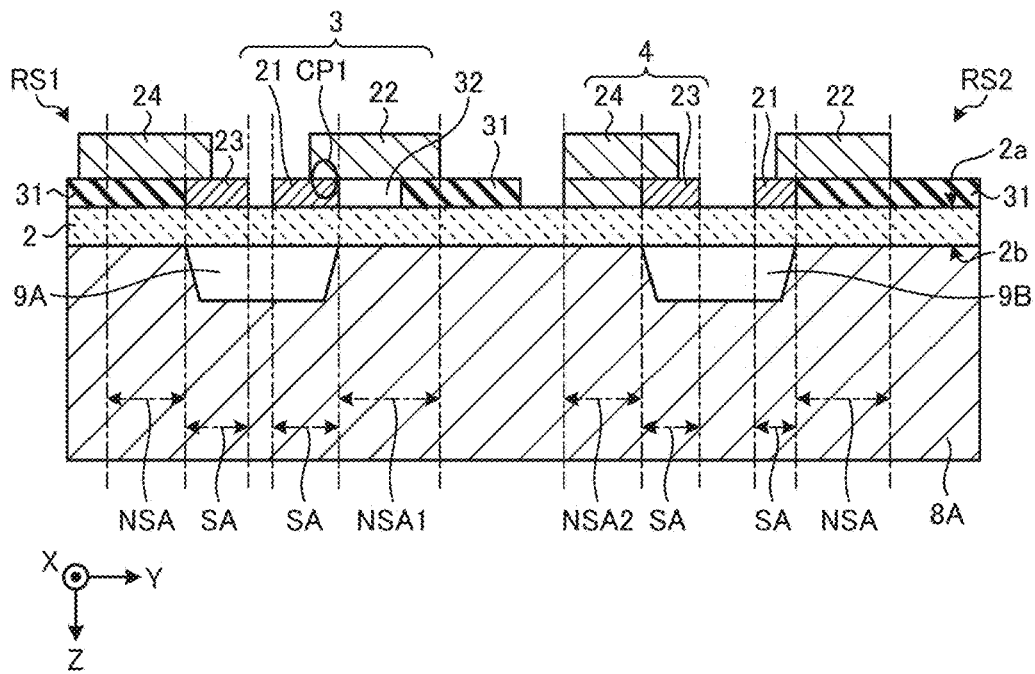
FIG. 18 is a cross-sectional view of an acoustic wave device according to a first modification of the second preferred embodiment of the present invention.

FIG. 18 is a cross-sectional view of an acoustic wave device according to a first modification of the second preferred embodiment. According to the first modification of the second preferred embodiment, as seen in the Z-direction, the first electrode 3 extends over the overlap region SA that overlaps the hollow 9A, and the non-overlap region NSA1 that does not overlap the hollow 9A. As seen in the Z-direction, the second electrode 4 extends over the overlap region SA that overlaps the hollow 9B, and the non-overlap region NSA2 that does not overlap the hollow 9B. In the non-overlap region NSA1 of the first electrode 3, the insulating film 31 and the void 32 are disposed between the first electrode 3 and the piezoelectric layer 2. In the non-overlap region NSA2 of the second electrode 4, the insulating film 31 and the void 32 are not disposed between the second electrode 4 and the piezoelectric layer 2. The connection portion CP1, which defines at least a portion of the first electrode 3 and connects the first portion 21 and the wiring layer 22, is disposed in the overlap region SA as seen in the Z-direction. As seen in the Z-direction, a portion of the wiring layer 22 excluding the connection portion CP1 overlaps the non-overlap region NSA1.

A first area, which is the area of the first electrode 3 in the non-overlap region NSA1 of the first resonator RS1 illustrated in FIG. 18, is larger than a second area, which is the area of the second electrode 4 in the non-overlap region NSA2 of the second resonator RS2. The insulating film 31 and the void 32 are present in the non-overlap region NSA1, which is the non-overlap region of the electrode with the relatively larger one of the first area and the second area, whereas the insulating film 31 and the void 32 are not present in the non-overlap region NSA2, which is the non-overlap region of the electrode with the relatively smaller one of the first area and the second area. The electrode with the relatively larger one of the first area and second area is also the one susceptible to greater vibration due to excitation. In the acoustic wave device according to Modification 1 of the second preferred embodiment, the insulating film 31 or the void 32 is present in the non-overlap area NSA1 of the electrode with the relatively larger one of the first area and the second area as described above. This helps to reduce vibration of the electrode, and consequently reduce degradation of filter characteristics.

Figure 19:
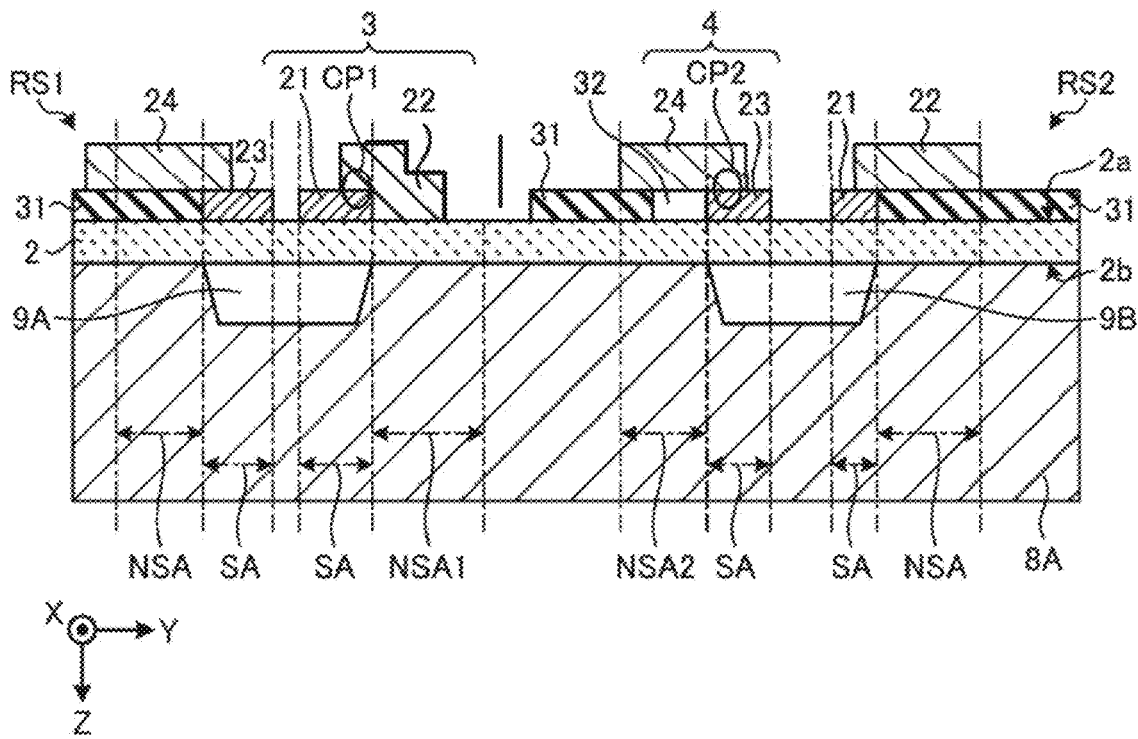
FIG. 19 is a cross-sectional view of an acoustic wave device according to a second modification of the second preferred embodiment of the present invention.

FIG. 19 is a cross-sectional view of an acoustic wave device according to a second modification of the second preferred embodiment. According to the second modification of the second preferred embodiment, as seen in the Z-direction, the first electrode 3 extends over the overlap region SA that overlaps the hollow 9A, and the non-overlap region NSA1 that does not overlap the hollow 9A. As seen in the Z-direction, the second electrode 4 extends over the overlap region SA that overlaps the hollow 9B, and the non-overlap region NSA2 that does not overlap the hollow 9B. In the non-overlap region NSA1 of the first electrode 3, the insulating film 31 and the void 32 are not disposed between the first electrode 3 and the piezoelectric layer 2. In the non-overlap region NSA2 of the second electrode 4, the insulating film 31 and the void 32 are disposed between the second electrode 4 and the piezoelectric layer 2. The connection portion CP2, which defines at least a portion of the second electrode 4 and connects the first portion 23 and the wiring layer 24, is disposed in the overlap region SA as seen in the Z-direction. As seen in the Z-direction, a portion of the wiring layer 24 excluding the connection portion CP2 overlaps the non-overlap region NSA2.

A first area, which is the area of the first electrode 3 in the non-overlap region NSA1 of the first resonator RS1 illustrated in FIG. 19, is larger than a second area, which is the area of the second electrode 4 in the non-overlap region NSA2 of the second resonator RS2. The insulating film 31 and the void 32 are not present in the non-overlap region NSA1, which is the non-overlap region of the electrode with the relatively larger one of the first area and the second area, whereas the insulating film 31 and the void 32 are present in the non-overlap region NSA2, which is the non-overlap region of the electrode with the relatively smaller one of the first area and the second area. A leaky wave LW is more likely to propagate to the electrode with the relatively smaller one of the first area and the second area. In the acoustic wave device according to Modification 2 of the second preferred embodiment, the insulating film 31 or the void 32 is present in the non-overlap area of the electrode with the relatively smaller one of the first area and the second area as described above. This helps to reduce the possibility of the leaky wave LW reaching the electrode, and consequently reduce degradation of filter characteristics.

Third Preferred Embodiment

Figure 20:
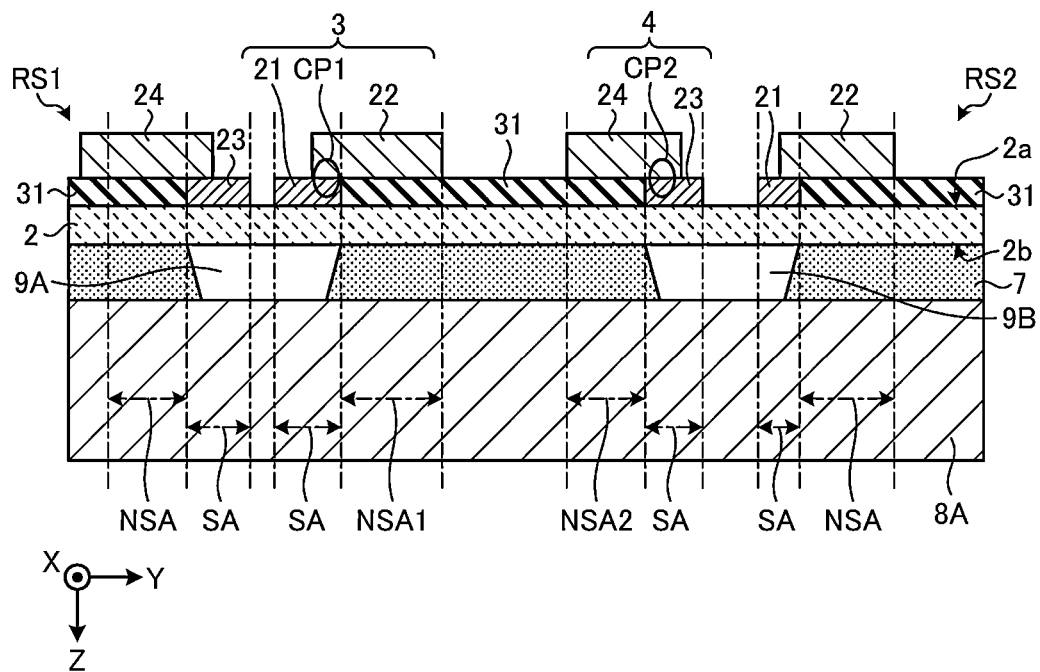
FIG. 20 is a cross-sectional view of an acoustic wave device according to a third preferred embodiment of the present invention.

FIG. 20 is a cross-sectional view of an acoustic wave device according to a third preferred embodiment. Unlike in the acoustic wave device according to the first preferred embodiment, in the acoustic wave device according to the third preferred embodiment, the hollow 9A and the hollow 9B are disposed in the intermediate layer 7. Features according to the third preferred embodiment that are identical to those according to the first preferred embodiment will be designated by the same reference signs and will not be described in further detail.

According to the third preferred embodiment, the presence of the hollow 9A and the hollow 9B in the intermediate layer 7 makes it possible to increase the accuracy of a membrane region of the piezoelectric layer 2 that overlaps the hollow 9A and the hollow 9B. According to the third preferred embodiment, the piezoelectric layer 2 may, in some cases, be provided with a hole for forming each of the hollow 9A and the hollow 9B. The piezoelectric layer 2 covers the hollow 9A and the hollow 9B except at the location of this hole. As described above, at least a portion of the hollow 9A, and at least a portion of the hollow 9B are covered by the piezoelectric layer 2.

The acoustic wave device according to the third preferred embodiment includes the support member 8A corresponding to a support substrate, the piezoelectric layer 2 that, as seen in the Z-direction of the support member 8A, overlaps the support member 8A, and the first electrode 3 and the second electrode 4. The first electrode 3 and the second electrode 4 extend over the first major surface 2a of the piezoelectric layer 2, face each other in the X-direction that crosses the Z-direction, and have mutually different potentials. The hollow 9A and the hollow 9B, which are disposed in the intermediate layer 7, are spaces located near the second major surface 2b of the piezoelectric layer 2. The hollow 9A and the hollow 9B are covered by the piezoelectric layer 2. As seen in the Z-direction, the first electrode 3 extends over the overlap region SA that overlaps the hollow 9A, and the non-overlap region NSA that does not overlap the hollow 9A. As seen in the Z-direction, the second electrode 4 extends over the overlap region SA that overlaps the hollow 9B, and the non-overlap region NSA that does not overlap the hollow 9B. In the non-overlap region NSA of the first electrode 3, the insulating film 31 is disposed between the first electrode 3 and the piezoelectric layer 2. In the non-overlap region NSA of the second electrode 4, the insulating film 31 is disposed between the second electrode 4 and the piezoelectric layer 2.

The presence of the insulating film 31 helps to reduce a leaky wave LW that emanates from the non-overlap region NSA of the first electrode 3 and the non-overlap region NSA of the second electrode 4. The presence of the insulating film 31 also helps to reduce the possibility of the leaky wave LW reaching the non-overlap region NSA of the first electrode 3 or the non-overlap region NSA of the second electrode 4. This leads to reduced ripples in the filter pass band QQ, and consequently reduced degradation of filter characteristics.

Fourth Preferred Embodiment

Figure 21:
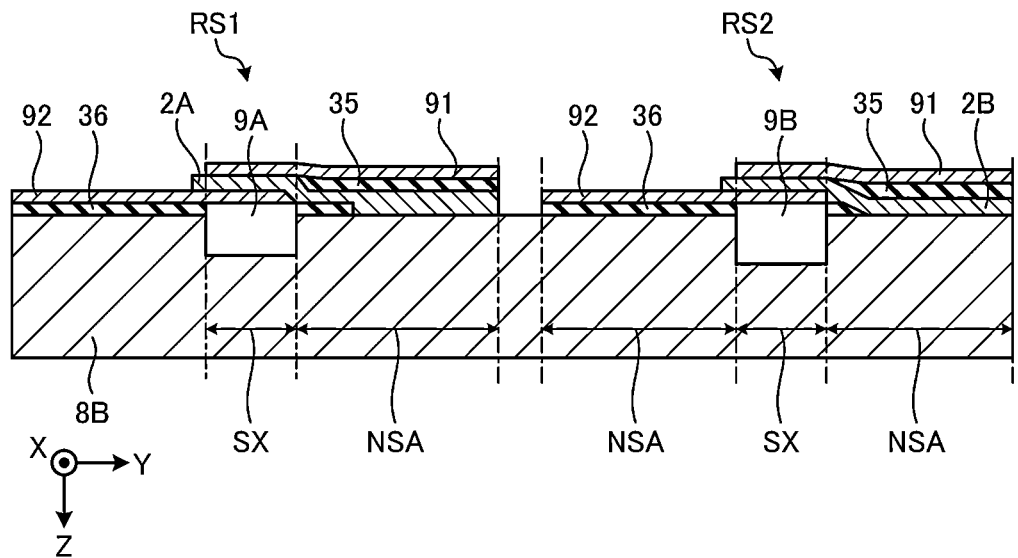
FIG. 21 is a cross-sectional view of an acoustic wave device according to a fourth preferred embodiment of the present invention.

FIG. 21 is a cross-sectional view of an acoustic wave device according to a fourth preferred embodiment. The acoustic wave device according to the fourth preferred embodiment includes an upper electrode 91, which corresponds to a first electrode, and a lower electrode 92, which corresponds to a second electrode, and piezoelectric layers 2A and 2B. The upper electrode 91 and the lower electrode 92 of the first resonator RS1 sandwich the piezoelectric layer 2A in the Z-direction. The upper electrode 91 and the lower electrode 92 of the second resonator RS2 sandwich the piezoelectric layer 2B in the Z-direction. In the acoustic wave device according to the fourth preferred embodiment, each of the upper electrode 91 and the lower electrode 92 defines a functional electrode. The acoustic wave device is also sometimes called a bulk acoustic wave (BAW) device.

In the acoustic wave device according to the fourth preferred embodiment, a single support member 8B supports the first resonator RS1 and the second resonator RS2. The second resonator RS2 is at a location different from that of the first resonator RS1, The hollow 9A and the hollow 9B, which are disposed in the support member 8B, are respectively covered by the piezoelectric layer 2A and the piezoelectric layer 2B. As seen in the Z-direction, the upper electrode 91 extends over an overlap region SX that overlaps the hollow 9A, and the non-overlap region NSA that does not overlap the hollow 9A. As seen in the Z-direction, the lower electrode 92 extends over the overlap region SX that overlaps the hollow 9B, and the non-overlap region NSA that does not overlap the hollow 9B. In the non-overlap regions NSA, an insulating film 35 is disposed between the upper electrode 91 and the piezoelectric layer 2A. In the non-overlap region NSA of the lower electrode 92, an insulating film 36 is disposed between the lower electrode 92 and the support member 8B.

The insulating film 35 and the insulating film 36 are made of the same material as that of the insulating film 31 mentioned above. The presence of the insulating film 35 and the insulating film 36 helps to reduce a leaky wave LW that emanates from the non-overlap region NSA of the upper electrode 91 and the non-overlap region NSA of the lower electrode 92. The presence of the insulating film 35 and the insulating film 36 also helps to reduce the possibility of the leaky wave LW reaching the overlap region SX. This leads to reduced ripples in the filter pass band QQ, and consequently reduced degradation of filter characteristics.

Fifth Preferred Embodiment

Figure 22:
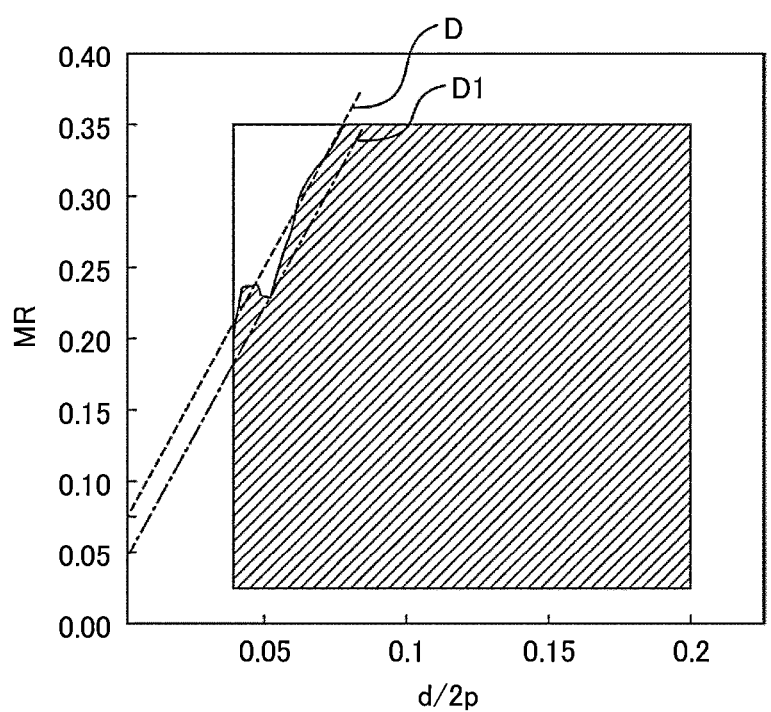
FIG. 22 is an illustration for explaining, for an acoustic wave device according to a fifth preferred embodiment of the present invention, the relationship between d/2p, metallization ratio MR, and fractional band width.

FIG. 22 is an illustration for explaining, for an acoustic wave device according to a fifth preferred embodiment, the relationship between d/2p, metallization ratio MR, and fractional band width. Features according to the fifth preferred embodiment that are identical to those according to the first preferred embodiment will be designated by the same reference signs and will not be described in further detail. As the acoustic wave device 1 according to the fifth preferred embodiment, acoustic wave devices 1 with different values of d/2p and MR are formed, and their fractional band widths are measured. The hatched region on the right-hand side of a broken line D in FIG. 22 represents a region with a fractional bandwidth of less than or equal to about 17%, for example. The boundary between the hatched region and a non-hatched region is represented as MR=about $3.5(d/2p)+0.075$. That is, MR=about $1.75(d/p)+0.075$. Accordingly, it is preferable that MR≤about $1.75(d/p)+0.075$. In that case, a fractional band width of less than or equal to about 17% can be easily obtained. A more preferable example of the above-mentioned region is the region on the right-hand side of an alternate long and short dashed line D1 in FIG. 22 that represents MR=about $3.5(d/2p)+0.05$. In other words, if MR≤about $1.75(d/p)+0.05$, this allows a fractional band width of less than or equal to about 17% to be obtained with reliability.

Sixth Preferred Embodiment

Figure 23:
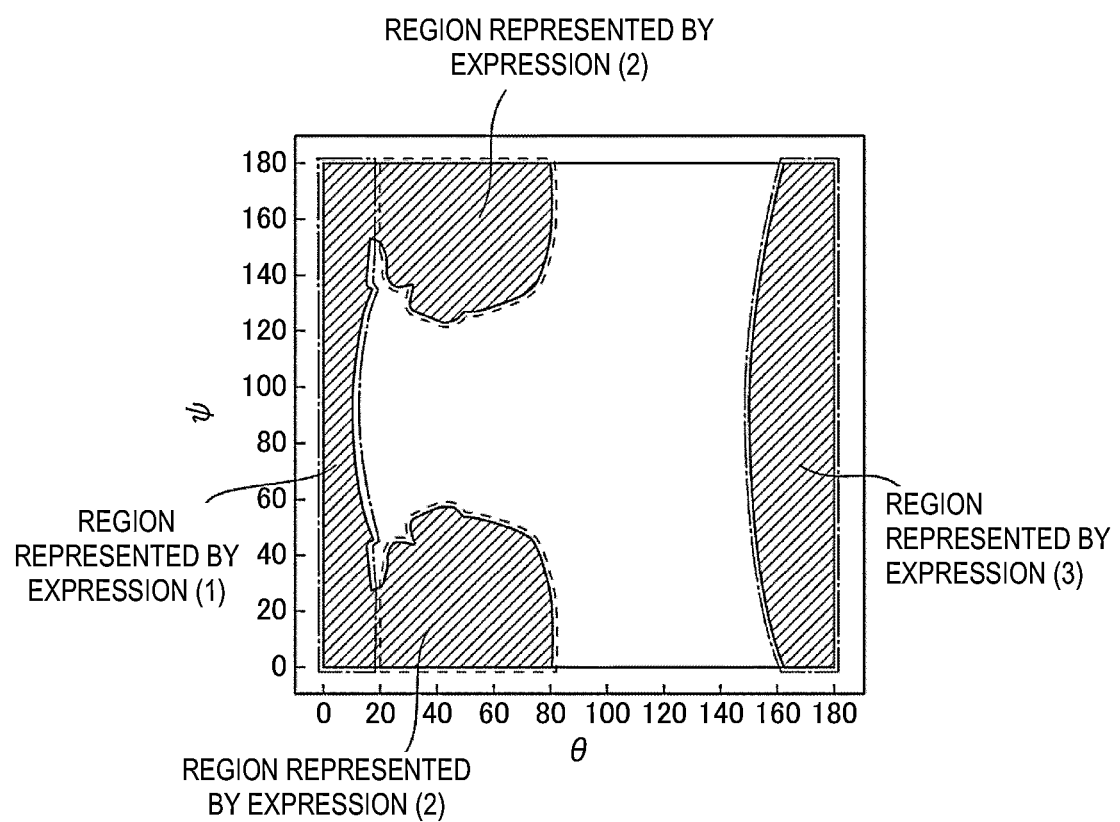
FIG. 23 illustrates, for an acoustic wave device according to a sixth preferred embodiment of the present invention, a map of fractional band width with respect to the Euler angles (0°, θ, ψ) of $LiNbO_3$ with d/p set as close to zero as possible.

FIG. 23 illustrates, for an acoustic wave device according to a sixth preferred embodiment, a map of fractional band width with respect to the Euler angles (0°, θ, ψ) of $LiNbO_3$ with d/p set as close to zero as possible. Features according to the sixth preferred embodiment that are identical to those according to the first preferred embodiment will be designated by the same reference signs and will not be described in further detail. Hatched regions in FIG. 23 represent regions where a fractional band width of at least greater than or equal to about 5% is obtained. The ranges of individual regions are approximated by Expressions (1), (2), and (3) below.

$$(0°±10°, 0° \text{ to } 20°, \text{any } \psi) \quad (1)$$

$$(0°±10°, 20° \text{ to } 80°, 0° \text{ to } 60°(1-(\theta-50)^2/900)^{1/2}) \text{ or } (0°±10°, 20° \text{ to } 80°, [180°-60°(1-(\theta-50)^2/900)^{1/2}] \text{ to } 180°) \quad (2)$$

$$(0°±10°, [180°-30°(1-(\psi-90)^2/8100)^{1/2}] \text{ to } 180°, \text{any } \psi) \quad (3)$$

Therefore, Euler angles within the range represented by Expression (1), (2), or (3) are preferred from the viewpoint of achieving a sufficiently large fractional band width.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer overlapping the support substrate as seen in a first direction; and
   a functional electrode extending over at least a first major surface of the piezoelectric layer; wherein
   a space is provided in a location opposite to the first major surface of the piezoelectric layer and at or adjacent to a second major surface of the piezoelectric layer;
   the space is at least partially covered by the piezoelectric layer;
   in the first direction, the functional electrode extends over an overlap region that overlaps the space, and a non-overlap region that does not overlap the space;
   in the overlap region, the functional electrode, and the first major surface of the piezoelectric layer are in contact with each other; and
   in the non-overlap region of the functional electrode, at least one of an insulating film and a void is located between the functional electrode and the piezoelectric layer.

2. The acoustic wave device according to claim 1, wherein
the piezoelectric layer includes lithium niobate or lithium tantalate;
the functional electrode includes a plurality of first electrodes arranged in a second direction, a first busbar extending in the second direction, a plurality of second electrodes arranged in the second direction, and a second busbar extending in the second direction;
the plurality of first electrodes are connected with the first busbar;
the plurality of second electrodes are connected with the second busbar; and
d/p has a value of d/p≤about 0.5, where d is a thickness of the piezoelectric layer, and p is a center-to-center distance between mutually adjacent ones of the plurality of first electrodes and the plurality of second electrodes.

3. The acoustic wave device according to claim 2, wherein a value of d/p is less than or equal to about 0.24.

4. The acoustic wave device according to claim 1, wherein
the functional electrode includes a first electrode and a second electrode extending over the first major surface of the piezoelectric layer, the first electrode and the second electrode facing each other in a second direction and being at mutually difference potentials, the second direction crossing the first direction;
the first electrode and the second electrode each extend over the overlap region and the non-overlap region; and
in the non-overlap region of at least one of the first electrode and the second electrode, at least one of the insulating film and the void is in at least one of a location between the first electrode and the piezoelectric layer and a location between the second electrode and the piezoelectric layer.

5. An acoustic wave device comprising:
a support substrate;
a piezoelectric layer overlapping the support substrate as seen in a first direction;
a first resonator extending over at least a first major surface of the piezoelectric layer; and
a second resonator at a location of the support substrate different from a location of the first resonator; wherein
the first resonator includes:
 a first space defined by a hollow in a portion of the support substrate, or a first space defined by an air gap between the support substrate and the piezoelectric layer;
 the piezoelectric layer covering at least a portion of the first space; and
 a first electrode and a second electrode of the first resonator, the first electrode and the second electrode of the first resonator each extending over a first overlap region and a non-overlap region, the first overlap region overlapping the first space as seen in the first direction, the non-overlap region not overlapping the first space as seen in the first direction, the first electrode and the second electrode of the first resonator facing each other in a second direction;
the second resonator includes:
 a second space defined by a hollow in a portion of the support substrate, or a second space defined by an air gap between the support substrate and the piezoelectric layer;
 the piezoelectric layer covering at least a portion of the second space; and
 a first electrode and a second electrode of the second resonator, the first electrode and the second electrode of the second resonator each extending over a second overlap region and the non-overlap region, the second overlap region overlapping the second space as seen in the first direction, the non-overlap region not overlapping the second space as seen in the first direction, the first electrode and the second electrode of the second resonator facing each other in the second direction;
the second space is at a location different from a location of the first space;
in at least a portion of the non-overlap region sandwiched between the first space and the second space, at least one of an insulating film and a void is provided in at least one of a location between the first electrode of the first resonator and the piezoelectric layer and a location between the second electrode of the second resonator and the piezoelectric layer; and
the first electrode of the first resonator, and the second electrode of the second resonator are in the non-overlap region sandwiched between the first space and the second space.

6. The acoustic wave device according to claim 5, wherein the insulating film is in at least one of a location between the first electrode and the piezoelectric layer and a location between the second electrode and the piezoelectric layer, and the insulating film is one of silicon oxide, silicon nitride, and resin.

7. The acoustic wave device according to claim 5, wherein in the non-overlap region of at least one of the first electrode and the second electrode, the void is between the first electrode and the piezoelectric layer or between the second electrode and the piezoelectric layer.

8. The acoustic wave device according to claim 5, wherein
the piezoelectric layer includes lithium niobate or lithium tantalate; and
the acoustic wave device is operable to generate a bulk wave in thickness shear mode as a main wave.

9. The acoustic wave device according to claim 5, wherein
the piezoelectric layer includes lithium niobate or lithium tantalate;
the acoustic wave device comprises a plurality of the first electrodes arranged in the second direction, a first busbar extending in the second direction, a plurality of the second electrodes arranged in the second direction, and a second busbar extending in the second direction;
the plurality of first electrodes are connected with the first busbar;
the plurality of second electrodes are connected with the second busbar; and
d/p has a value of d/p≤about 0.5, where d is a thickness of the piezoelectric layer, and p is a center-to-center distance between the first electrode and the second electrode.

10. The acoustic wave device according to claim 9, wherein a value of d/p is less than or equal to about 0.24.

11. The acoustic wave device according to claim 9, wherein the plurality of first electrodes arranged in the second direction include mutually adjacent first electrodes, and one of the plurality of second electrode is between the mutually adjacent first electrodes.

12. The acoustic wave device according to claim 5, wherein a metallization ratio MR satisfies MR≤about 1.75 (d/p)+0.075, the metallization ratio MR being a ratio of an area of the first electrode and the second electrode within an excitation region to the excitation region, the excitation region being a region where the first electrode and the second electrode overlap each other as seen in a direction in which the first electrode and the second electrode face each other, d being a thickness of the piezoelectric layer, and p being a center-to-center distance between the first electrode and the second electrode.

13. The acoustic wave device according to claim 5, wherein lithium niobate or lithium tantalate included in the piezoelectric layer has Euler angles (ϕ, θ, ψ) within a range represented by Expression (1), Expression (2), or Expression (3):

$$(0°±10°, 0° \text{ to } 20°, \text{any } \psi) \ldots \quad (1)$$

$$(0°±10°, 20° \text{ to } 80°, 0° \text{ to } 60°(1-(\theta-50)^2/900)^{1/2}) \text{ or } (0°±10°, 20° \text{ to } 80°, [180°-60°(1-(\theta-50)^2/900)^{1/2}] \text{ to } 180°) \ldots \quad (2)$$

$$(0°±10°, [180°-30°(1-(\psi-90)^2/8100)^{1/2}] \text{ to } 180°, \text{any } \psi) \ldots \quad (3).$$

14. The acoustic wave device according to claim 5, further comprising:
   a plurality of first electrodes arranged in the second direction;
   a first busbar extending in the second direction;
   a plurality of second electrodes arranged in the second direction; and
   a second busbar extending in the second direction; wherein
   the plurality of first electrodes are connected with the first busbar; and
   the plurality of second electrodes are connected with the second busbar.

15. The acoustic wave device according to claim 5, wherein at least one of the first electrode and the second electrode includes a first portion and a second portion, the first portion extending over the piezoelectric layer, the second portion provided at least partially over the first portion and connecting with the first portion.

16. The acoustic wave device according to claim 15, wherein
   as seen in the first direction, at least a portion of the first portion, and a connection portion between the first portion and the second portion overlap at least one of the overlap region, the first overlap region, and the second overlap region; and
   as seen in the first direction, a portion of the second portion excluding the connection portion overlaps the non-overlap region.

17. The acoustic wave device according to claim 5, wherein each of the first resonator and the second resonator defines a ladder filter.

18. The acoustic wave device according to claim 17, wherein
   the first resonator is a series-arm resonator of the ladder filter; and
   the second resonator is a parallel-arm resonator of the ladder filter.

19. The acoustic wave device according to claim 5, wherein the second space extends in a third direction relative to the first space, the third direction crossing the first direction and the second direction.

20. The acoustic wave device according to claim 5, wherein
   at least one of the first electrode of the first resonator, and the second electrode of the second resonator is a hot electrode;
   the first electrode of the first resonator extends over the first overlap region, and the non-overlap region sandwiched between the first space and the second space; and
   the second electrode of the second resonator extends over the second overlap region, and the non-overlap region sandwiched between the first space and the second space.

* * * * *